(12) United States Patent
Ito et al.

(10) Patent No.: US 8,962,712 B2
(45) Date of Patent: Feb. 24, 2015

(54) PHOTOSENSITIVE RESIN COMPOSITION, DRY FILM THEREOF, AND PRINTED WIRING BOARD USING THEM

(75) Inventors: Nobuhito Ito, Hiki-gun (JP); Kazuyoshi Yoneda, Hiki-gun (JP); Masao Arima, Hiki-gun (JP)

(73) Assignee: Taiyo Holdings Co., Ltd., Tokyo (JP)

( * ) Notice: Subject to any disclaimer, the term of this patent is extended or adjusted under 35 U.S.C. 154(b) by 243 days.

(21) Appl. No.: 13/517,648

(22) Filed: Jun. 14, 2012

(65) Prior Publication Data

US 2012/0250268 A1 Oct. 4, 2012

Related U.S. Application Data

(63) Continuation of application No. PCT/JP2010/072355, filed on Dec. 13, 2010.

(30) Foreign Application Priority Data

Dec. 14, 2009 (JP) ................................ 2009-282954

(51) Int. Cl.

| | | |
|---|---|---|
| C08K 3/22 | (2006.01) | |
| C08K 5/5313 | (2006.01) | |
| C08K 5/5399 | (2006.01) | |
| G03F 7/038 | (2006.01) | |
| H05K 1/18 | (2006.01) | |
| H05K 3/28 | (2006.01) | |
| C08G 18/34 | (2006.01) | |
| C08G 18/64 | (2006.01) | |
| C08G 18/73 | (2006.01) | |
| C08G 18/80 | (2006.01) | |
| C09D 175/04 | (2006.01) | |
| G03F 7/027 | (2006.01) | |
| G03F 7/031 | (2006.01) | |
| G03F 7/035 | (2006.01) | |
| C08L 63/04 | (2006.01) | |

(52) U.S. Cl.
CPC .............. *H05K 3/287* (2013.01); *C08G 18/348* (2013.01); *C08G 18/6407* (2013.01); *C08G 18/73* (2013.01); *C08G 18/80* (2013.01); *C09D 175/04* (2013.01); *G03F 7/027* (2013.01); *G03F 7/031* (2013.01); *G03F 7/035* (2013.01); *H05K 2201/012* (2013.01)
USPC ........ 523/451; 361/748; 430/284.1; 523/452; 523/457; 525/480; 525/481

(58) Field of Classification Search
None
See application file for complete search history.

(56) References Cited

U.S. PATENT DOCUMENTS

| 7,195,857 B2 | 3/2007 | Tamura et al. |
|---|---|---|
| 8,048,613 B2 | 11/2011 | Itoh et al. |
| 8,101,336 B2 | 1/2012 | Itoh et al. |
| 2004/0009428 A1 | 1/2004 | Tamura et al. |
| 2009/0029181 A1 | 1/2009 | Shibasaki et al. |
| 2009/0042126 A1 | 2/2009 | Tanaka et al. |
| 2009/0194319 A1 | 8/2009 | Itoh et al. |
| 2012/0111620 A1 | 5/2012 | Shibasaki et al. |
| 2012/0125672 A1 | 5/2012 | Minegishi et al. |
| 2012/0168215 A1 | 7/2012 | Shiina et al. |

FOREIGN PATENT DOCUMENTS

| CN | 101093359 A | | 12/2007 |
|---|---|---|---|
| CN | 101320213 A | | 12/2008 |
| JP | 11-288090 | | 10/1999 |
| JP | 2003-131362 | | 5/2003 |
| JP | 2005-126581 A | * | 5/2005 |
| JP | 2005-187746 A | * | 7/2005 |
| JP | 2007-10794 | | 1/2007 |
| JP | 2007-41107 | | 2/2007 |
| JP | 2007-191587 | | 8/2007 |
| JP | 2008-74938 | | 4/2008 |
| JP | 2008-74938 A | * | 4/2008 |
| JP | 2008-299293 | | 12/2008 |
| JP | 2008-299293 A | * | 12/2008 |
| JP | 2009-86414 A | * | 4/2009 |
| JP | 2009-250985 | | 10/2009 |
| JP | 2009-250985 A | * | 10/2009 |
| JP | 2010-39388 A | * | 2/2010 |
| JP | 2010-39389 A | * | 2/2010 |
| WO | WO 2007/083690 A1 | | 7/2007 |

OTHER PUBLICATIONS

International Search Report mailed Feb. 1, 2011 in International Patent Application No. PCT/JP2010/072355, filed Dec. 13, 2010 (submitted with translation of categories).

Combined Office Action and Search Report issued Jan. 22, 2013 in Chinese Patent Application No. 201080056910.1 with partial English translation and English translation of categories of cited documents.

* cited by examiner

*Primary Examiner* — Robert Sellers
(74) *Attorney, Agent, or Firm* — Oblon, Spivak, McClelland, Maier & Neustadt, L.L.P.

(57) ABSTRACT

An alkali-developable photosensitive resin composition comprises a carboxyl group-containing urethane resin having a biphenyl novolak structure, a photopolymerization initiator, and aluminum hydroxide and/or a phosphorus-containing compound. The composition may be formulated as a photocurable and thermosetting resin composition by further incorporating therein a thermosetting component having a plurality of cyclic ether groups and/or cyclic thioether groups in the molecule, besides the components described above. The photosensitive resin composition may further contain a colorant. By using the photosensitive resin composition or a dry film thereof, a printed wiring board having a flame-retardant cured film, such as a solder resist, formed from the halogen-free composition can be provided while imposing little burden on the environment, the cured film being flame-retardant and reduced in warpage and having various excellent properties including bending characteristics, resistance to soldering heat, and resistance to gold plating.

18 Claims, No Drawings

PHOTOSENSITIVE RESIN COMPOSITION, DRY FILM THEREOF, AND PRINTED WIRING BOARD USING THEM

CROSS-REFERENCE TO RELATED APPLICATIONS

This is a continuation of Application PCT/JP2010/072355, filed Dec. 13, 2010, which was published under PCT Article 21(2).

BACKGROUND OF THE INVENTION

1. Field of the Invention

This invention relates to a photosensitive resin composition which is a halogen-free formulation imposing little burden on the environment and is capable of forming a solder resist which is flame-retardant, exhibits little warpage and excels in bending characteristics. This invention further relates to a dry film and a flame-retardant printed wiring board which use such a photosensitive resin composition.

2. Description of the Prior Art

Heretofore, flame retardancy is required for a printed wiring board and a flexible wiring board (hereinafter abbreviated as "FPC") because they are mounted in electronic devices, and the flame retardancy is also required for solder resists which are parts thereof. Among these wiring boards, the FPC usually uses a polyimide substrate which is, unlike a printed wiring board of a glass-epoxy substrate, a thin film. However, since the thickness of the solder resist which should be applied to the printed wiring board is the same as that to the FPC, in the case of the thin FPC the burden of flame retardancy to the solder resist becomes large relatively.

Therefore, various proposals for imparting flame retardancy to the solder resist have been made hitherto. For example, JP 2007-10794A proposes a flame-retardant photosensitive resin composition for FPC, which composition comprises (a) a binder polymer, (b) a photopolymerizable compound having a halogenated aromatic ring, such as a bromophenyl group, and a polymerizable ethylenically unsaturated bond, such as an acryloyl group, in its molecule, (c) a photopolymerization initiator, (d) a blocked isocyanate compound, and (e) a phosphorus-containing compound having a phosphorus atom in its molecule. However, the use of a halogenated compound such as a compound having a halogenated aromatic ring and a polymerizable unsaturated double bond is not preferred from the viewpoint of the environmental impact.

As for the printed circuit board of the thin film represented by the FPC, the occurrence of warpage due to cure shrinkage at the time of photo-curing or thermal curing of a solder resist becomes a problem.

On the other hand, as a halogen-free flame-retardant solder resist, JP 2007-41107A, for example, proposes a photosensitive resin composition which is soluble in an aqueous alkaline solution and comprises a resin, which is soluble in an aqueous alkaline solution and produced by the addition reaction of a polybasic acid anhydride to a reaction product of a biphenyl novolak type epoxy resin and an unsaturated monocarboxylic acid, a biphenyl novolak type epoxy resin as a curing agent, and a photopolymerization initiator. However, this composition is not enough to reduce warpage and is insufficient in flexing properties.

SUMMARY OF THE INVENTION

An object of the present invention is to provide an alkali-developable photosensitive resin composition for printed wiring boards, which composition is a halogen-free formulation imposing little burden on the environment and suitable as a solder resist for printed wiring boards, in particular flexible wiring boards (FPC) represented by TAB (tape automated bonding), COF (chip-on film), etc., which is flame-retardant, exhibits little warpage and excels in bending characteristics, and also excels in various characteristics, such as resistance to soldering heat and resistance to gold plating.

A further object of the present invention is to provide a dry film which exhibits little warpage and excels in various characteristics, such as flame retardancy and bending characteristics, and a printed wiring board having a flame-retardant coating film of such outstanding characteristics by using such a photosensitive resin composition.

To accomplish the object described above, the present invention provides an alkali-developable photosensitive resin composition for a printed wiring board, comprising:
 a carboxyl group-containing urethane resin having a biphenyl novolak structure,
 a photopolymerization initiator, and
 either one or both of aluminum hydroxide and a phosphorus-containing compound.

In a preferred embodiment, the carboxyl group-containing urethane resin mentioned above is a carboxyl group-containing urethane resin obtained by causing a diol compound produced by the reaction of an epoxy resin having a biphenyl novolak structure and a monobasic acid to react with a carboxyl group-containing diol compound and a diisocyanate compound. The preferred photopolymerization initiator includes an oxime ester compound. In a further preferred embodiment, the composition may be formulated as a photocurable and thermosetting resin composition by further incorporating therein a thermosetting component, besides the components described above. In another preferred embodiment, the composition further contains a colorant. Such a photosensitive resin composition can be advantageously used in the formation of a solder resist on a printed wiring board.

According to the present invention, there is further provided a dry film obtained by applying the photosensitive resin composition mentioned above on a film and then drying it. Further, the present invention provides a printed wiring board comprising a substrate and a cured film formed on the substrate, the cured film being obtained by applying the photosensitive resin composition mentioned above on the substrate to form a coating film, or laminating the dry film mentioned above on the substrate to form a coating film, and photo-curing the coating film in a predetermined pattern.

Since the photosensitive resin composition of the present invention comprises a carboxyl group-containing urethane resin having a biphenyl novolak structure, a photopolymerization initiator, and aluminum hydroxide and/or a phosphorus-containing compound, it is a halogen-free formulation imposing little burden on the environment and capable of forming a film which is flame-retardant and reduced in warpage, exhibits excellent bending characteristics, and also excels in various other characteristics, such as resistance to soldering heat and resistance to gold plating. Accordingly, by using the photosensitive resin composition of the present invention, it is possible to provide a dry film which exhibits little warpage and excels in various characteristics, such as flame retardancy and bending characteristics, and a printed wiring board having a flame-retardant solder resist film of such outstanding characteristics.

DETAILED DESCRIPTION OF THE INVENTION

The present inventors, after pursuing a diligent study to solve the problems mentioned above, have found that the photosensitive resin composition comprising a carboxyl group-containing urethane resin having a biphenyl novolak structure, a photopolymerization initiator, and aluminum hydroxide and/or a phosphorus-containing compound exhibits little warpage, excels in bending characteristics, and also exhibits a remarkable effect in flame retardancy. As a result, the present invention has been perfected. It was surprising in view of the problems of the prior art that the composition of the present invention has the effect of attaining all of these various characteristics.

Now, the components of the photosensitive resin composition of the present invention will be described in detail below.

As the carboxyl group-containing urethane resin having the biphenyl novolak structure included in the photosensitive resin composition of the present invention, a resin obtained by causing a diol compound produced by the reaction of an epoxy resin having a biphenyl novolak structure of the following formula (I) and a monobasic acid to react with a carboxyl group-containing diol compound and a diisocyanate compound may be advantageously used.

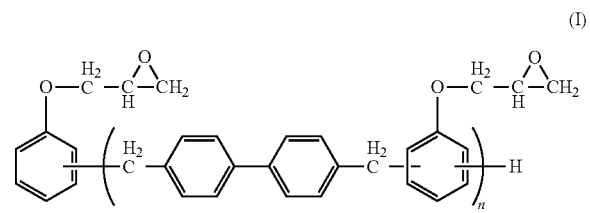

(I)

wherein "n" represents an average value falling in the range of 1.01 to 5.

The epoxy resin having the above-mentioned biphenyl novolak structure is commercially available as NC-3000 (manufactured by Nippon Kayaku Co., Ltd.).

As the aforementioned monobasic acid, though it is not limited to a particular one, an unsaturated monocarboxylic acid, particularly those having a (meth)acryloyl group are preferred from the viewpoint of that a photosensitive group (an acryloyl group or a methacryloyl group) is introduced into the resultant carboxyl group-containing urethane resin to impart the photo-curing properties thereto. As concrete examples thereof, acrylic acid, methacrylic acid, crotonic acid, cinnamic acid, β-acryloxy propionic acid, a reaction product of a hydroxyalkyl (meth)acrylate having one hydroxyl group and one (meth)acryloyl group with a dibasic acid anhydride, a reaction product of a polyfunctional (meth)acrylate having one hydroxyl group and a plurality of (meth)acryloyl groups with a dibasic acid anhydride, and caprolactone-modified products of these monobasic acids, etc. may be cited. These monobasic acids may be used either singly or in the form of a combination of two or more members. Among other monobasic acids cited above, those having a (meth)acryloyl group, such as acrylic acid and methacrylic acid, prove to be particularly desirable.

Incidentally, the term "(meth)acrylate" as used in the present specification refers collectively to acrylate, methacrylate and a mixture thereof. This holds good for other similar representation.

As the reaction of the epoxy resin having the aforementioned biphenyl novolak structure and the monobasic acid, any hitherto known methods for the reaction of an epoxy group and a carboxyl group may be adopted. For example, the reaction is carried out in the presence or absence of an organic solvent to be described hereinafter and in the presence of a polymerization inhibitor such as hydroquinone and oxygen, usually at a temperature in the approximate range of 50° C. to 150° C. In this reaction, as occasion demands, a tertiary amine such as triethylamine, a quaternary ammonium salt such as triethylbenzyl ammonium chloride, an imidazole compound such as 2-ethyl-4-methylimidazole, or a phosphorus compound such as triphenylphosphine may be added to the reaction mixture as a catalyst.

In the reaction mentioned above, the ratio of the ingredients (the charging ratio of the raw materials) is desired to be such that the ratio of the acid group of the monobasic acid is in the range of 1.0 to 1.2 equivalent weights per one equivalent weight of the epoxy group of the epoxy resin having the aforementioned biphenyl novolak structure.

The carboxyl group-containing urethane resin having the biphenyl novolak structure of the present invention is obtained by causing the diol compound produced by the reaction of the epoxy resin having the biphenyl novolak structure and the monobasic acid as mentioned above to react with a diol compound having a carboxyl group and a diisocyanate compound. As this urethanization reaction, any hitherto known methods may be adopted. Although this reaction proceeds in the absence of a catalyst by agitating and mixing the reactants at a temperature of from room temperature to 100° C., heating to about 70-100° C. is preferred in order to increase the reaction rate. In the reaction mentioned above, the ratio of the ingredients (the charging ratio of the raw materials) is desired to be such that the ratio of the total hydroxyl groups of the diol compounds (the diol compound produced by the reaction of the epoxy resin having the biphenyl novolak structure and the monobasic acid, and the carboxyl group-containing diol compound) is in the range of 1.0 to 2.5 equivalent weights per one equivalent weight of the isocyanate group of the diisocyanate compound. The ratio of the hydroxyl group equivalent of the diol compound produced by the reaction of the epoxy resin having the biphenyl novolak structure and the monobasic acid to that of the carboxyl group-containing diol compound is desired to be 2:8 to 8:2.

As the carboxyl group-containing diol compound used for the synthesis of the aforementioned carboxyl group-containing urethane resin having the biphenyl novolak structure, though not limited to a particular compound, for example, dimethylol propionic acid, dimethylol butylic acid, a reaction product of a polyol compound of three or more functionalities and a polybasic acid anhydride, etc. may be cited. These compounds may be used either singly or in the form of a combination of two or more members.

As the diisocyanate compound used for the synthesis of the aforementioned carboxyl group-containing urethane resin having the biphenyl novolak structure, a well-known and commonly used aromatic or aliphatic diisocyanate compound may be used. Among other diisocyanate compounds, a diisocyanate compound which is synthesized without using a phosgene method is preferred in order to reduce the amount of halogen in the resultant resin. Further, from the viewpoint of increasing the flexibility of the resultant carboxyl group-containing urethane resin having the biphenyl novolak structure, an aliphatic isocyanate is more preferred. As concrete examples thereof, for example, 1,6-hexamethylene diisocyanate, 1,4-tetramethylene diisocyanate, 1,12-dodecamethylene diisocyanate, 2,2,4-trimethyl hexamethylene diisocyanate, 2,4,4-trimethyl hexamethylene diisocyanate, etc. may be cited. These diisocyanate compounds may be used either singly or in the form of a combination of two or more members. Among other diisocyanate compounds, the use of 2,4, 4-trimethyl hexamethylene diisocyanate is particularly preferred from the viewpoint of flexibility.

Since the aforementioned carboxyl group-containing urethane resin having the biphenyl novolak structure has many carboxyl groups in the side chains of a backbone polymer, it serves as a crosslinking point in the thermal curing. When it is used to formulate a photosensitive composition, the resultant composition is capable of being developable with an aqueous alkaline solution.

The acid value of the aforementioned carboxyl group-containing urethane resin having the biphenyl novolak structure is preferred to be in the range of 30 to 200 mg KOH/g, preferably in the range of 40 to 120 mg KOH/g. From the viewpoint of alkali-developability, if the acid value of the carboxyl group-containing urethane resin is less than 30 mg KOH/g, the development of the composition with an aqueous alkaline solution will be performed only with difficulty. Conversely, if the acid value exceeds 200 mg KOH/g, the dissolving out of the exposed area in a developing solution will proceed, the line width will become narrow unduly, occasionally a coating film is dissolved out in a developing solution and separated from a substrate regardless of the exposed area or unexposed area and, as a result, the formation of a proper resist pattern may be attained only with difficulty.

Although the weight average molecular weight of the aforementioned carboxyl group-containing urethane resin having the biphenyl novolak structure will vary depending on the skeleton of the resin, it is generally desired to be in the range of 2,000-150,000, preferably 5,000-100,000. If the weight average molecular weight is less than 2,000, the coating film containing the resin will be at a disadvantage in acquiring insufficient resistance to heat. Conversely, if the weight average molecular weight exceeds 150,000, the composition containing the resin will be at a disadvantage in acquiring inferior storage stability.

The amount of the aforementioned carboxyl group-containing urethane resin having the biphenyl novolak structure to be incorporated in the composition is preferred to account for a proportion in the range of 5 to 60% by weight, preferably 10 to 50% by weight, based on the total amount of the composition. If the amount of the resin to be incorporated is unduly smaller than the lower limit of the range mentioned above, the coating film containing the resin will be at a disadvantage in acquiring decreased film strength. Conversely, if the amount is unduly larger than the upper limit of the range mentioned above, the composition containing the resin will be at a disadvantage in acquiring increased viscosity or inferior coating properties.

As the photopolymerization initiator mentioned above, one or more of photopolymerization initiators selected from the group consisting of oxime ester-based photopolymerization initiators having an oxime ester group, α-aminoacetophenone-based photopolymerization initiators, and acylphosphine oxide-based photopolymerization initiators may be used.

As the commercially available oxime ester-based photopolymerization initiators, CGI-325, IRGACURE (registered trademark) OXE01, and IRGACURE OXE02 manufactured by Ciba Japan Ltd., N-1919 and ADEKA ARKLS NCI-831 manufactured by ADEKA CORPORATION, etc. may be cited. Further, photopolymerization initiators having two oxime ester groups in its molecule may also be preferably used. As concrete examples thereof, oxime ester compounds having the carbazole structure represented by the following general formula may be cited.

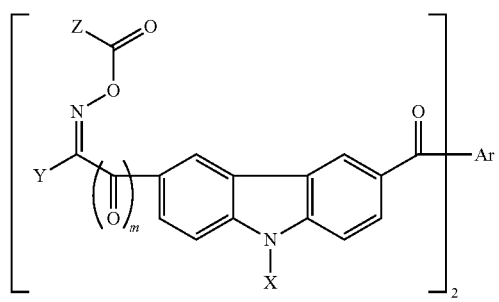

In the formula, X represents a hydrogen atom, an alkyl group of 1-17 carbon atoms, an alkoxy group of 1-8 carbon atoms, a phenyl group, a phenyl group substituted by an alkyl group of 1-17 carbon atoms, an alkoxy group of 1-8 carbon atoms, an amino group, or an alkylamino group or dialkylamino group having an alkyl group of 1-8 carbon atoms, or a naphthyl group substituted by an alkyl group of 1-17 carbon atoms, an alkoxy group of 1-8 carbon atoms, an amino group, or an alkylamino group or dialkylamino group having an alkyl group of 1-8 carbon atoms, Y and Z independently represent a hydrogen atom, an alkyl group of 1-17 carbon atoms, an alkoxy group of 1-8 carbon atoms, a halogen group, a phenyl group, a phenyl group substituted by an alkyl group of 1-17 carbon atoms, an alkoxy group of 1-8 carbon atoms, an amino group, or an alkylamino group or dialkylamino group having an alkyl group of 1-8 carbon atoms, or a naphthyl group substituted by an alkyl group of 1-17 carbon atoms, an alkoxy group of 1-8 carbon atoms, an amino group, or an alkylamino group or dialkylamino group having an alkyl group of 1-8 carbon atoms, an anthryl group, a pyridyl group, a benzofuryl group, or a benzothienyl group, Ar represents an alkylene of 1-10 carbon atoms, a vinylene, a phenylene, a biphenylene, a pyridylene, a naphthylene, an anthorylene, a thienylene, a furylene, 2,5-pyrrole-diyl, 4,4'-stilbene-diyl, or 4,2'-styrene-diyl, and "m" is an integer of 0 or 1.

Particularly, it is preferred that in the above-mentioned formula X and Y be a methyl group or an ethyl group, respectively, Z be a methyl or a phenyl, m is 0, and Ar is a phenylene, a naphthylene, or a thienylene.

The amount of the above-mentioned oxime ester-based photopolymerization initiator to be incorporated in the composition is preferred to be in the range of 0.01 to 5 parts by weight, based on 100 parts by weight of the aforementioned carboxyl group-containing urethane resin. If the amount is less than 0.01 part by weight based on 100 parts by weight of the above-mentioned carboxyl-group containing urethane resin, the photo-curing properties of the resultant photosensitive resin composition on copper becomes insufficient, thereby undesirably causing the separation of a coating film and deterioration of the properties of the coating film, such as resistance to chemicals. Conversely, if the amount of the oxime ester-based photopolymerization initiator exceeds 5 parts by weight based on 100 parts by weight of the above-mentioned carboxyl-group containing urethane resin, undesirably the photo-curing properties in a deep portion of the coating film will tend to become inferior due to the increasing light absorption by the photopolymerization initiator in the surface of the coating film of solder resist. The more preferred amount is 0.5 to 3 parts by weight, based on 100 parts by weight of the aforementioned carboxyl group-containing urethane resin.

As concrete examples of the α-aminoacetophenone-based photopolymerization initiator, 2-methyl-1-[4-(methylthio)

phenyl]-2-morpholinopropan-1-one, 2-benzyl-2-dimethylamino-1-(4-morpholinophenyl)-butan-1-one, 2-(dimethylamino)-2-[(4-methylphenyl)methyl]-1-[4-(4-morpholinyl)phenyl]-butan-1-one, N,N-dimethylaminoacetophenone, etc. may be cited. As the commercially available products thereof, IRGACURE 907, IRGACURE 369, and IRGACURE 379 manufactured by Ciba Japan Ltd., etc. may be cited.

As concrete examples of the acylphosphine oxide-based photopolymerization initiator, 2,4,6-trimethylbenzoyl-diphenyl phosphine oxide, bis(2,4,6-trimethyl benzoyl)-phenyl phosphine oxide, bis(2,6-dimethoxybenzoyl)-2,4,4-trimethyl-pentyl phosphine oxide, etc. may be cited. As the commercially available products thereof, LUCIRIN (registered trademark) TPO manufactured by BASF Ltd., IRGACURE 819 manufactured by Ciba Japan Ltd., etc. may be cited.

The amount of these α-aminoacetophenone-based photopolymerization initiator and acylphosphine oxide-based photopolymerization initiator to be incorporated in the composition is preferred to be in the range of 0.01 to 15 parts by weight, based on 100 parts by weight of the aforementioned carboxyl group-containing urethane resin. If the amount is less than 0.01 part by weight based on 100 parts by weight of the above-mentioned carboxyl-group containing urethane resin, the photo-curing properties of the resultant photosensitive resin composition on copper become insufficient, thereby undesirably causing the separation of a coating film and deterioration of the properties of the coating film, such as resistance to chemicals. Conversely, if the amount exceeds 15 parts by weight based on 100 parts by weight of the above-mentioned carboxyl-group containing urethane resin, undesirably the effect of reducing outgassing will not be attained and the photo-curing properties in a deep portion of the coating film will tend to become inferior due to the increasing light absorption by the photopolymerization initiator in the surface of the coating film of solder resist. The more preferred amount is 0.5 to 10 parts by weight, based on 100 parts by weight of the aforementioned carboxyl group-containing urethane resin.

As the other photopolymerization initiators, photo-initiator aids and sensitizers which may be preferably used in the photosensitive resin composition of the present invention, a benzoin compound, an acetophenone compound, an anthraquinone compound, a thioxanthone compound, a ketal compound, a benzophenone compound, a tertiary amine compound, a xanthone compound, etc. may be cited.

As concrete examples of the benzoin compound, for example, benzoin, benzoin methyl ether, benzoin ethyl ether, benzoin isopropyl ether, etc. may be cited.

As concrete examples of the acetophenone compound, for example, acetophenone, 2,2-dimethoxy-2-phenyl acetophenone, 2,2-diethoxy-2-phenyl acetophenone, 1,1-dichloroacetophenone, etc. may be cited.

As concrete examples of the anthraquinone compound, for example, 2-methylanthraquinone, 2-ethylanthraquinone, 2-t-butylanthraquinone, 1-chloroanthraquinone, etc. may be cited.

As concrete examples of the thioxanthone compound, for example, 2,4-dimethylthioxanthone, 2,4-diethylthioxanthone, 2-chlorothioxanthone, 2,4-diisopropylthioxanthone, etc. may be cited.

As concrete examples of the ketal compound, for example, acetophenone dimethyl ketal, benzyl dimethyl ketal, etc. may be cited.

As concrete examples of the benzophenone compound, for example, benzophenone, 4-benzoyldiphenylsulfide, 4-benzoyl-4'-methyldiphenylsulfide, 4-benzoyl-4'-ethyldiphenylsulfide, 4-benzoyl-4'-propyldiphenylsulfide, etc. may be cited.

As concrete examples of the tertiary amine compound, for example, an ethanolamine compound and a compound having dialkylaminobenzene structure may be cited. As the commercially available products thereof, for example, dialkylaminobenzophenones such as 4,4'-dimethylaminobenzophenone (NISSO Cure MABP manufactured by Nippon Soda Co., Ltd.) and 4,4'-diethylaminobenzophenone (EAB manufactured by Hodogaya Chemical Co., Ltd.), dialkylamino group-containing coumarin compounds such as 7-(diethylamino)-4-methyl-2H-1-benzopyran-2-one (7-(diethylamino)-4-methylcoumarin), ethyl 4-dimethylaminobenzoate (Kaya Cure (registered trademark) EPA manufactured by Nippon Kayaku Co., Ltd.), ethyl 2-dimethylaminobenzoate (Quantacure DMB manufactured by International Biosynthetic Inc.), (n-butoxy)ethyl 4-dimethylaminobenzoate (Quantacure BEA manufactured by International Biosynthetic Inc.), isoamylethyl p-dimethylaminobenzoate (Kaya Cure DMBI manufactured by Nippon Kayaku Co., Ltd.), 2-ethylhexyl 4-dimethylaminobenzoate (Esolol 507 manufactured by Van Dyk GmbH), 4,4'-diethylaminobenzophenone (EAB manufactured by Hodogaya Chemical Co., Ltd.), etc. may be cited.

Among other compounds, a thioxanthone compound and a tertiary amine compound are preferred. Particularly, the incorporation of the thioxanthone compound is preferred from the viewpoint of the photo-curing properties in a deep portion of a coating film. In particular, the incorporation of the thioxanthone compound such as 2,4-dimethylthioxanthone, 2,4-diethylthioxanthone, 2-chlorothioxanthone, and 2,4-diisopropylthioxanthone proves to be preferable.

The amount of such a thioxanthone compound to be incorporated in the composition is preferred to be not more than 20 parts by weight, based on 100 parts by weight of the aforementioned carboxyl group-containing urethane resin. If the amount of the thioxanthone compound exceeds 20 parts by weight based on 100 parts by weight of the above-mentioned carboxyl group-containing urethane resin, undesirably the photo-curing properties of the resultant photosensitive resin composition will be deteriorated when its film thickness is large, thereby leading to the increase in cost of a product. The more preferred amount is not more than 10 parts by weight, based on 100 parts by weight of the aforementioned carboxyl group-containing urethane resin.

As the tertiary amine compound, a compound having dialkyl aminobenzene structure is preferred, in particular a dialkylaminobenzophenone compound, a dialkylamino group-containing coumarin compound exhibiting the maximal absorption wavelength in 350-450 nm, and ketocoumarins are preferred.

As the dialkylaminobenzophenone compound, 4,4'-diethylaminobenzophenone is preferred because its toxicity is low. Since the dialkylamino group-containing coumarin compound exhibits the maximal absorption wavelength in 350-410 nm of the ultraviolet region, it has weak tinting power and thus makes possible to provide a colorless, transparent photosensitive composition as well as, by the use of a coloring pigment, a colored solder resist film reflecting the color of the coloring pigment itself. Particularly, 7-(diethylamino)-4-methyl-2H-1-benzopyran-2-one is preferred because it exhibits excellent sensitizing effect to the laser beam of a wavelength of 400-410 nm.

The amount of the tertiary amine compound mentioned above to be incorporated in the composition is preferred to be in the range of 0.1 to 20 parts by weight, based on 100 parts by weight of the aforementioned carboxyl group-containing urethane resin. If the amount is less than 0.1 part by weight based on 100 parts by weight of the above-mentioned carboxyl group-containing urethane resin, the sufficient sensitizing effect will not be attained. Conversely, if the amount exceeds 20 parts by weight based on 100 parts by weight of the above-mentioned carboxyl group-containing urethane resin, undesirably the photo-curing properties in a deep portion of a coating film will tend to become inferior due to the increasing light absorption by the tertiary amine compound in the surface of a dried coating film of solder resist. The more preferred amount is 0.1 to 10 parts by weight, based on 100 parts by weight of the aforementioned carboxyl group-containing urethane resin.

These photopolymerization initiators, photo-initiator aids and sensitizers may be used either singly or in the form of a mixture of two or more members.

The total amount of the photopolymerization initiator, the photo-initiator aid and the sensitizer mentioned above is preferred to be not more than 35 parts by weight, based on 100 parts by weight of the aforementioned carboxyl group-containing urethane resin having the biphenyl novolak structure. If the amount exceeds 35 parts by weight based on 100 parts by weight of the above-mentioned carboxyl group-containing urethane resin, the photo-curing properties in a deep portion of a coating film will tend to become inferior due to the light absorption by these compounds.

In particular, it is preferable that the oxime ester-based hotopolymerization initiator should be used in the photosensitive resin composition of the present invention. The effect is that not only the sufficient sensitivity can be acquired even with a small amount of the oxime ester-based hotopolymerization initiator, but also contraction of a cured film can be suppressed because the volatilization of the photopolymerization initiator in the post heating process of the thermal curing and the mounting of parts is little, thereby making possible to considerably reduce the warpage of the cured film.

The use of the acyl phosphine oxide-based photopolymerization initiator makes possible to increase the photo-curing properties in a deep portion of a coating film at the time of the photoreaction and also effectively heighten the phosphorus concentration in a cured film by incorporating in a cured product network the ingredient of the phosphorus-containing compound originated from the initiator through the cleavage thereof by irradiation, thereby further improving the flame retardancy.

Incidentally, since the photopolymerization initiators, photo-initiator aids and sensitizers mentioned above absorb the light of specific wavelength, under certain circumstances they may act as an ultraviolet light absorber and the sensitivity may become low. However, they are not used for the purpose of only increasing the sensitivity of a composition. By formulating the composition so as to absorb the light of specific wavelength, as occasion demands, thereby increasing the photo-reactivity in the surface, it is possible to change the line shape and the opening of a resist to a perpendicular shape, a tapered shape, or a reverse tapered shape, and to increase the processing accuracy of a line width or an opening diameter.

In the photosensitive resin composition of the present invention, the use of either the oxime ester-based photopolymerization initiator or the acyl phosphine oxide-based photopolymerization initiator is effective. However, from the viewpoint of the balance between the line shape and the opening of the resist as mentioned above, the improvement in the processing accuracy, and also the improvement in reduction of warpage, bending characteristics, and flame retardancy, the combined use of the oxime ester-based photopolymerization initiator and the acyl phosphine oxide-based photopolymerization initiator is still more preferred.

As aluminum hydroxide mentioned above, any known general-purpose aluminum hydroxide may be used. For example, the HIGILITE (registered trademark) series HW, H21, H31, H32, H42M, and H43M manufactured by Showa Denko K.K., etc. may be used. Incidentally, since the finer particle diameter of aluminum hydroxide is effective in increasing the folding endurance, it is desirable from the viewpoint of the flame retardancy and bending characteristics of the resultant cured film that the aluminum hydroxide should be used by previously carrying out the dispersion processing together with a solvent or a resin to the primary grain size by a bead mill etc. and filtering out the particles of not less than 3 μm, more preferably not less than 1 μm by filtering etc.

The amount of aluminum hydroxide mentioned above to be incorporated in the composition is preferred to be in the range of 0 to 300 parts by weight, preferably 0 to 200 parts by weight, more preferably 0 to 150 parts by weight, further preferably 10 to 120 parts by weight, based on 100 parts by weight of the aforementioned carboxyl group-containing urethane resin. If the amount exceeds 300 part by weight based on 100 parts by weight of the above-mentioned carboxyl group-containing urethane resin, the sufficient bending characteristics of a cured film will not be attained.

It is preferable that the photosensitive resin composition of the present invention should contain a phosphorus-containing compound. As the phosphorus-containing compound, those commonly used and known as an organophosphorus flame retardant are advantageously used and include a phosphoric ester, a condensation phosphoric ester, a cyclic phosphazene compound, a phosphazene oligomer or a compound represented by the following general formula (II):

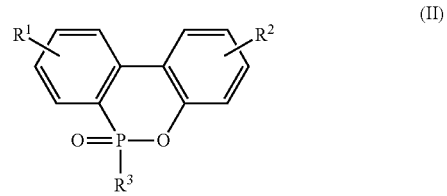

wherein $R^1$, $R^2$, and $R^3$ independently represent substituents other than a halogen atom, respectively.

As the commercially available phosphorus-containing compounds represented by the above-mentioned general formula (II), HCA, SANKO-220, M-ESTER, HCA-HQ (all trade names for the products manufactured by SANKO Co., Ltd.), etc. may be cited.

As the particularly preferred phosphorus-containing compound used in the present invention, those having an acrylate group or a phenolic hydroxyl group as a reactive group, oligomer or polymer thereof, a phosphazene oligomer, a phosphinate, etc. may be cited.

The phosphorus-containing (meth)acrylate having phosphorus and a plurality of (meth)acryloyl groups in its molecule is advantageously used. As concrete examples thereof, such compounds that $R^1$ and $R^2$ in the aforementioned general formula (II) are a hydrogen atom and $R^3$ is a (meth)acrylate derivative may be cited. In general, such compounds may be synthesized by the Michael addition reaction of 9,10-dihydro-9-oxa-10-phosphaphenanthrene-10-oxide and a well-known and commonly used polyfunctional (meth)acrylate monomer.

As the well-known and commonly used (meth)acrylate monomer mentioned above, diacrylates of glycols, such as ethylene glycol, methoxy tetraethylene glycol, polyethylene glycol, propylene glycol; polyvalent acrylates of polyvalent alcohols, such as hexandiol, trimethylolpropane, pentaerythritol, dipentaerythritol, and tris(hydroxyethyl) isocyanurate, or ethylene oxide adducts, propylene oxide adducts or caprolactone adducts thereof; polyvalent acrylates such as phenoxy acrylate, bisphenol A diacrylate and ethylene oxide adducts or propylene oxide adducts of these phenols; urethane acrylates of the above-mentioned polyalcohols; polyvalent acrylates of glycidyl ethers, such as glycerol diglycidyl ether, glycerol triglycidyl ether, trimethylolpropane triglycidyl ether, and triglycidyl isocyanurate; and melamine acrylates; and/or methacrylates corresponding to the acrylates mentioned above may be cited.

The phosphorus-containing compound having a phenolic hydroxyl group has the high hydrophobicity and heat resistance, does not exhibit reduction in electrical properties by hydrolysis, and enjoys high resistance to soldering heat. Further, when an epoxy resin is selected from among thermosetting resins and used as a suitable combination therewith, the compound reacts with an epoxy group and is incorporated into a network, and therefore the advantage of not causing bleed-out of the compound after curing will be attained. As the commercially available products thereof, HCA-HQ manufactured by Sanko Co., Ltd., etc. may be cited.

The phosphorus-containing compound of oligomer or polymer has the advantages of exhibiting little reduction in bending characteristics owing to the influence of its alkyl chain and no bleed-out of the compound after curing owing to the large molecular weight. As the commercially available products thereof, M-Ester-HP manufactured by Sanko Co., Ltd., phosphorus-containing VYLON (registered trademark) 337 manufactured by TOYOBO Co., Ltd., etc. may be cited.

As the phosphazene oligomer, a phenoxy phosphazene compound may be effectively used. Although it includes substituted or unsubstituted phenoxy phosphazene oligomers or cyclic products of a trimer, tetramer and pentamer in the form of liquid or solid powder, any compounds may be advantageously used. As the commercially available products thereof, FP-100, FP-300, FP-390, etc. manufactured by FUSHIMI Pharmaceutical Co., Ltd. may be cited. Among other compounds, the phenoxy phosphazene oligomers substituted by an alkyl group or a polar group, such as a hydroxyl group and a cyano group, are preferred because they exhibit high solubility in a carboxyl group-containing resin and do not cause any disadvantage, such as recrystallization, even if they are added to the composition in a large amount.

By the use of a phosphinate, it is possible to improve the flame retardancy of a cured film without impairing the flexibility thereof. By the use of such a phosphinate which excels in resistance to heat, it is possible to suppress the bleed-out of the flame retardant during the hot pressing at the time of the mounting of parts. As the commercially available products thereof, EXOLIT (registered trademark) OP 930, EXOLIT OP 935, etc. manufactured by Clariant LTD. may be cited.

The amount of the phosphorus-containing compound mentioned above as a flame retardant to be incorporated in the composition is preferred to be in the range of 0 to 200 parts by weight, particularly preferably 0 to 100 parts by weight, further preferably 10 to 80 parts by weight, based on 100 parts by weight of the aforementioned carboxyl group-containing urethane resin having the biphenyl novolak structure. If the amount is unduly larger than the upper limit of the range mentioned above, the resultant cured film will be at a disadvantage in acquiring inferior bending characteristics.

Further, a thermosetting component may be added to the photosensitive resin composition of the present invention in order to impart heat resistance thereto. As concrete examples of the thermosetting component, any known and commonly used thermosetting resins, such as a blocked isocyanate compound, an amino resin, a maleimide compound, a benzoxazine resin, a carbodiimide resin, a cyclocarbonate compound, a polyfunctional epoxy compound, a polyfunctional oxetane compound, an episulfide resin, may be used. Among other thermosetting components, the thermosetting components having a plurality of cyclic ether groups and/or cyclic thioether groups (hereinafter briefly referred to as cyclic (thio)ether groups) in its molecule prove to be desirable. Many kinds of the thermosetting components having these cyclic (thio)ether groups are commercially available and can give various properties by their structures.

The thermosetting component having a plurality of cyclic (thio)ether groups in its molecule as mentioned above is a compound having a plurality of either one or two kinds of 3-, 4- or 5-membered cyclic ether groups or cyclic thioether groups in its molecule. For example, a compound having a plurality of epoxy groups in its molecule, i.e. a polyfunctional epoxy compound, a compound having a plurality of oxetanyl groups in its molecule, i.e. a polyfunctional oxetane compound, a compound having a plurality of thioether groups in its molecule, i.e. an episulfide resin may be cited.

As the polyfunctional epoxy compounds, for example, bisphenol A type epoxy resins represented by jER (registered trademark) 828, jER 834, jER 1001, and jER 1004 manufactured by Japan Epoxy Resin K.K., EPICLON (registered trademark) 840, EPICLON 850, EPICLON 1050, and EPICLON 2055 manufactured by DIC Corporation., Epo Tohto (registered trademark) YD-011, YD-013, YD-127, and YD-128 manufactured by Tohto Kasei Co., Ltd., D.E.R. 317, D.E.R. 331, D.E.R. 661, and D.E.R. 664 manufactured by The Dow Chemical Company, ARALDITE 6071, ARALDITE 6084, ARALDITE GY250, and ARALDITE GY260 manufactured by Ciba Japan Ltd., Sumi-epoxy ESA-011, ESA-014, ELA-115, and ELA-128 manufactured by Sumitomo Chemical Co., Ltd., and A.E.R. 330, A.E.R. 331, A.E.R. 661, and A.E.R. 664 manufactured by Asahi Chemical Industry Co., Ltd. (all trade names); brominated epoxy resins represented by jER YL903 manufactured by Japan Epoxy Resin K.K., EPICLON 152 and EPICLON 165 manufactured by DIC Corporation., Epo Tohto YDB-400 and YDB-500 manufactured by Tohto Kasei Co., Ltd., D.E.R. 542 manufactured by The Dow Chemical Company, ARALDITE 8011 manufactured by Ciba Japan Ltd., Sumi-epoxy ESB-400 and ESB-700 manufactured by Sumitomo Chemical Co., Ltd., and A.E.R. 711 and A.E.R. 714 manufactured by Asahi Chemical Industry Co., Ltd. (all trade names); novolak type epoxy resins represented by jER 152 and jER 154 manufactured by Japan Epoxy Resin K.K., D.E.N. 431 and D.E.N. 438 manufactured by The Dow Chemical Company, EPICLON N-730, EPICLON N-770, and EPICLON N-865 manufactured by DIC Corporation., Epo Tohto YDCN-701 and YDCN-704 manufactured by Tohto Kasei Co., Ltd., ARALDITE ECN1235, ARALDITE ECN1273, ARALDITE ECN1299, and ARALDITE XPY307 manufactured by Ciba Japan Ltd., EPPN (registered trademark)-201, EOCN (registered trademark)-1025, EOCN-1020, EOCN-104S, RE-306, and NC-3000H manufactured by Nippon Kayaku Co., Ltd., Sumi-epoxy ESCN-195× and ESCN-220 manufactured by Sumitomo Chemical Co., Ltd., and A.E.R. ECN-235 and ECN-299 manufactured by Asahi Chemical Industry Co., Ltd. (all trade names); bisphenol F type epoxy resins represented by EPICLON 830 manufactured by DIC Corporation., jER 807 manufactured by Japan Epoxy Resin K.K., Epo Tohto YDF-170, YDF-175, and YDF-2004 manufactured by Tohto Kasei Co., Ltd., and ARALDITE XPY306 manufactured by Ciba Japan Ltd. (all trade names); hydrogenated bisphenol A type epoxy resins represented by Epo Tohto ST-2004, ST-2007, and ST-3000 manufactured by Tohto Kasei Co., Ltd. (all trade names); glycidylamine type epoxy resins represented by jER 604 manufactured by Japan Epoxy Resin K.K., Epo Tohto YH-434 manufactured by Tohto Kasei Co., Ltd., ARALDITE MY720 manufactured by Ciba Japan Ltd., and Sumi-epoxy ELM-120 manufactured by Sumitomo Chemical Co., Ltd. (all trade names); hydantoin type epoxy resins represented by ARALDITE CY-350 manufactured by Ciba Japan Ltd. (trade name); alicyclic epoxy resins represented by Celloxide (registered trademark) 2021 manufactured by Daicel Chemical Industries, Ltd., and ARALDITE CY175 and CY179 manufactured by Ciba Japan Ltd. (all trade names); trihydroxyphenyl methane type epoxy resins represented by YL-933 manufactured by Japan Epoxy Resin K.K., T.E.N. manufactured by The Dow Chemical Company, and EPPN-501 and EPPN-502 manufactured by Nippon Kayaku Co., Ltd. (all trade names); bixylenol type or biphenol type epoxy resins or mixtures thereof represented by YL-6056, YX-4000, and YL-6121 manufactured by Japan Epoxy Resin K.K. (all trade names); bisphenol S type epoxy resins represented by EBPS-200 manufactured by Nippon Kayaku Co., Ltd., EPX-30 manufactured by ADEKA CORPORATION, and EXA-1514 manufactured by DIC Corporation. (all trade names); bisphenol A novolak type epoxy resins represented by jER 157S (trade name) manufactured by Japan Epoxy Resin K.K.; tetraphenylol ethane type epoxy resins represented by jER YL-931 manufactured by Japan Epoxy Resin K.K., and ARALDITE 163 manufactured by Ciba Japan Ltd. (all trade names); heterocyclic epoxy resins represented by ARALDITE PT810 (trade name) manufactured by Ciba Japan Ltd. and TEPIC (registered trademark) manufactured by Nissan Chemical Industries Ltd.; diglycidyl phthalate resin represented by BLEMMER (registered trademark) DGT manufactured by Nippon Oil and Fats Co., Ltd.; tetraglycidyl xylenoyl ethane resins represented by ZX-1063 (trade name) manufactured by Tohto Kasei Co., Ltd.; naphthalene group-containing epoxy resins represented by ESN-190 and ESN-360 manufactured by Shinnittetsu Chemical Co., Ltd. and HP-4032, EXA-4750, and EXA-4700 manufactured by DIC Corporation. (all trade names); dicyclopentadiene skeleton-containing epoxy resins represented by HP-7200 and HP-7200H and flexible tough epoxy resins represented by EXA-4816, EXA-4822 and EXA-4850 series manufactured by DIC Corporation. (all trade names); glycidylmethacrylate copolymer type epoxy resins represented by CP-50S and CP-50M manufactured by Nippon Oil and Fats Co., Ltd. (all trade names); and copolymeric epoxy resin of cyclohexylmaleimide and glycidyl methacrylate may be cited, but are not limited to these epoxy resins. These epoxy resins may be used either singly or in the form of a combination of two or more members. Among other epoxy resins cited above, biphenyl novolak type epoxy resins, bixylenol type epoxy resins or mixtures thereof prove to be particularly desirable.

As the polyfunctional oxetane compounds, bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, their oligomers or copolymers, and etherified products of an oxetane alcohol with a hydroxyl group-containing resin, such as a novolak resin, poly(p-hydroxystyrene), cardo type bisphenols, calixarenes, calixresorcinarenes, or silsesquioxane, may be cited. Besides, copolymers of an unsaturated monomer having an oxetane ring with an alkyl (meth)acrylate may be cited.

As the aforementioned episulfide resins having a plurality of cyclic thioether groups in its molecule, for example, YL7000 (a bisphenol A type episulfide resin) manufactured by Japan Epoxy Resin K.K., YSLV-120TE manufactured by Tohto Kasei Co., Ltd., etc. may be cited. Further, an episulfide resin containing a sulfur atom in place of an oxygen atom of an epoxy group of a novolak type epoxy resin obtained by the similar synthetic method may be used.

The amount of the thermosetting component having a plurality of cyclic (thio)ether groups in its molecule to be incorporated in the composition is preferred to be in the range of 0.6 to 2.5 equivalent weights, preferably 0.8 to 2.0 equivalent weights per one equivalent weight of the carboxyl group of the carboxyl group-containing urethane resin mentioned above. If the amount of the thermosetting component having a plurality of cyclic (thio)ether groups in its molecule is less than 0.6 equivalent weight per one equivalent weight of the carboxyl group of the carboxyl group-containing urethane resin, undesirably the carboxyl group will remain in a solder resist film so that the resistance to heat, the resistance to alkalis, the electrical insulating properties, etc. of the film will be deteriorated. Conversely, if the amount of the thermosetting component exceeds 2.5 equivalent weights per one equivalent weight of the carboxyl group of the carboxyl group-containing urethane resin, undesirably the cyclic (thio)ether group of a low molecular weight will remain in a dried coating film so that the strength of the coating film will be deteriorated.

As other thermosetting components which can be advantageously used in the composition, amino resins such as a melamine derivative and a benzoguanamine derivative may be cited. For example, a methylol melamine compound, a methylol benzoguanamine compound, a methylol glycoluryl compound, a methylol urea compound, etc. may be cited. Further, an alkoxymethylated melamine compound, an alkoxymethylated benzoguanamine compound, an alkoxymethylated glycoluryl compound, and an alkoxymethylated urea compound are obtained by converting the methylol group of each of the methylol melamine compound, the methylol benzoguanamine compound, the methylol glycoluryl compound, and the methylol urea compound into an alkoxy methyl group, respectively. This alkoxy methyl group is not limited to a particular one and may be, for example, a methoxymethyl group, an ethoxymethyl group, a propoxymethyl group, a butoxymethyl group, etc. Particularly, a melamine derivative having the formalin concentration of not more than 0.2%, which is friendly to the human body and environment, prove to be desirable.

As commercially available products thereof, for example, Cymel (registered trademark) 300, Cymel 301, Cymel 303, Cymel 370, Cymel 325, Cymel 327, Cymel 701, Cymel 266, Cymel 267, Cymel 238, Cymel 1141, Cymel 272, Cymel 202, Cymel 1156, Cymel 1158, Cymel 1123, Cymel 1170, Cymel 1174, Cymel UFR65, and Cymel 300 (all manufactured by Mitsui-Cytec Ltd.), NIKALAC (registered trademark) Mx-750, NIKALAC Mx-032, NIKALAC Mx-270, NIKALAC Mx-280, NIKALAC Mx-290, NIKALAC Mx-706, NIKALAC Mx-708, NIKALAC Mx-40, NIKALAC Mx-31, NIKALAC Ms-11, NIKALAC Mw-30, NIKALAC Mw-30HM, NIKALAC Mw-390, NIKALAC Mw-100LM, and NIKALAC Mw-750LM (all manufactured by Sanwa Chemicals Co., Ltd.), etc. may be cited.

The above-mentioned thermosetting components may be used either singly or in the form of a combination of two or more members.

Further, a compound having a plurality of isocyanate groups or blocked isocyanate groups in its molecule may be added to the photosensitive resin composition of the present invention for the purpose of increasing the curing properties of the composition and the toughness of the resultant cured film. As such compounds having a plurality of isocyanate groups or blocked isocyanate groups in its molecule, a compound having a plurality of isocyanate groups in its molecule, i.e. a polyisocyanate compound, a compound having a plurality of blocked isocyanate groups in its molecule, i.e. a blocked isocyanate compound, etc., may be cited.

As the polyisocyanate compound mentioned above, for example, an aromatic polyisocyanate, an aliphatic polyisocyanate, or an alicyclic polyisocyanate is used. As concrete examples of the aromatic polyisocyanate, 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate, and 2,4-tolylene dimer may be cited. As concrete examples of the aliphatic polyisocyanate, tetramethylene diisocyanate, hexamethylene diisocyanate, methylene diisocyanate, trimethyl hexamethylene diisocyanate, 4,4-methylene-bis(cyclohexylisocyanate), and isophorone diisocyanate may be cited. As concrete examples of the alicyclic polyisocyanate, bicycloheptane triisocyanate may be cited. Further, adducts, biuret-modified products, and isocyanurate-modified products of the isocyanate compounds enumerated above may be cited.

A blocked isocyanate group contained in a blocked isocyanate compound is a group which is temporarily inactivated by protecting the isocyanate group through the reaction with a blocking agent. When heated to a predetermined temperature, the blocking agent dissociates to produce an isocyanate group.

As the blocked isocyanate compound, an addition reaction product of an isocyanate compound and an isocyanate blocking agent is used. As the isocyanate compound which can react with a blocking agent, an isocyanurate type, a biuret type, and an adduct type thereof may be cited. As this isocyanate compound, for example, an aromatic polyisocyanate, an aliphatic polyisocyanate, or an alicyclic polyisocyanate is used. As concrete examples of the aromatic polyisocyanate, the aliphatic polyisocyanate, and the alicyclic polyisocyanate, those enumerated above may be cited.

As the isocyanate blocking agent, for example, phenolic blocking agents, such as phenol, cresol, xylenol, chlorophenol, and ethylphenol; lactam-based blocking agents such as ε-caprolactam, δ-valerolactam, γ-butyrolactam, and β-propiolactam; active methylene-based blocking agents such as ethyl acetoacetate and acetylacetones; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; oxime-based blocking agents such as formaldehydroxime, acetoaldoxime, acetoxime, methylethyl ketoxime, diacetylmonoxime, and cyclohexane oxime; mercaptan-based blocking agents such as butyl mercaptan, hexyl mercaptan, t-butyl mercaptan, thiophenol, methylthiophenol, and ethylthiophenol; acid amide-based blocking agent such as acetic amide and benzamide; imide-based blocking agents such as succinic imide and maleic imide; amine-based blocking agents such as xylidine, aniline, butylamine, and dibutylamine; imidazole-based blocking agents such as imidazole and 2-ethylimidazole; and imine-based blocking agents such as methylene imine and propylene imine may be cited.

As the blocked isocyanate compounds, commercially available products may be used. For example, Sumidur (registered trademark) BL-3175, BL-4165, BL-1100, and BL-1265, Desmodur (registered trademark) TPLS-2957, TPLS-2062, TPLS-2078, and TPLS-2117, Desmotherm (registered trademark) 2170, and Desmotherm 2265 (all trade names of the products manufactured by Sumitomo Beyer urethane Co., Ltd.), CORONATE (registered trademark) 2512, CORONATE 2513, and CORONATE 2520 (all trade names of the products manufactured by Nippon Polyurethane Industry Co., Ltd.), B-830, B-815, B-846, B-870, B-874, and B-882 (all trade names of the products manufactured by Mitsui Takeda Chemicals Inc.), TPA-B80E, 17B-60PX, and E402-B80T (all trade names of the products manufactured by Asahi Kasei Chemicals Corporation) may be cited. Incidentally, Sumidur BL-3175 and BL-4265 are obtained using methylethyl oxime as a blocking agent.

The above-mentioned compound having a plurality of isocyanate groups or blocked isocyanate groups in its molecule may be used either singly or in the form of a combination of two or more members.

The amount of such a compound having a plurality of isocyanate groups or blocked isocyanate groups in its molecule to be incorporated in the composition is preferred to be in the range of 1 to 100 parts by weight, more preferably 2 to 70 parts by weight, based on 100 parts by weight of the aforementioned carboxyl group-containing urethane resin. If the amount is less than 1 part by weight based on 100 parts by weight of the above-mentioned carboxyl group-containing urethane resin, the sufficient toughness of a cured film will not be attained. Conversely, if the amount exceeds 100 parts by weight, the composition will be at a disadvantage in acquiring inferior storage stability.

A catalyst for urethanization may be added to the photosensitive resin composition of the present invention for the purpose of promoting the curing reaction of a hydroxyl group or carboxyl group with an isocyanate group. As the catalyst for urethanization, it is preferred to use at least one of the catalysts selected from the group consisting of a tin-based catalyst, a metal chloride, a metal acetylacetonate, a metal sulfate, an amine compound or/and an amine salt.

As the tin-based catalyst mentioned above, for example, organic tin compounds, such as stannous octoate and dibutyl tin dilaurate, and inorganic tin compounds may be cited.

As the metal chloride mentioned above, chlorides of metal consisting of Cr, Mn, Co, Ni, Fe, Cu, or Al, for example, cobalt (III) chloride, nickel (II) chloride, iron (III) chloride, etc. may be cited.

As the metal acetylacetonate mentioned above, acetylacetonates of metal consisting of Cr, Mn, Co, Ni, Fe, Cu, or Al, for example, cobalt acetylacetonate, nickel acetylacetonate, iron acetylacetonate, etc. may be cited.

As the metal sulfate mentioned above, sulfates of metal consisting of Cr, Mn, Co, Ni, Fe, Cu, or Al, for example, copper sulfate etc. may be cited.

As the amine compound mentioned above, hitherto known compounds, for example, triethylene diamine, N,N,N',N'-tetramethyl-1,6-hexanediamine, bis(2-dimethylaminoethyl) ether, N,N,N',N''N''-pentamethyldiethylenetriamine, N-methyl morpholine, N-ethyl morpholine, N,N-dimethylethanolamine, dimorpholino diethylether, N-methylimidazole, dimethylamino pyridine, triazine, N'-(2- hydroxyethyl)-N,N,N'-trimethyl-bis(2-aminoethyl)ether, N,N-dimethylhexanol amine, N,N-dimethylamino ethoxyethanol, N,N,N'-trimethyl-N'-(2-hydroxyethyl) ethylenediamine, N-(2-hydroxyethyl)-N,N,N"N"-tetramethyl diethylenetriamine, N-(2-hydroxypropyl)-N,N',N"N"'-tetramethyl diethylenetriamine, N,N,N'-trimethyl-N'-(2-hydroxyethyl) propanediamine, N-methyl-N'-(2-hydroxyethyl) piperazine, bis(N,N-dimethylaminopropyl) amine, bis(N,N-dimethylaminopropyl) isopropanolamine, 2-amino quinuclidine, 3-amino quinuclidine, 4-amino quinuclidine, 2-quinuclidinol, 3-quinuclidinol, 4-quinuclidinol, 1-(2'-hydroxypropyl) imidazole, 1-(2'-hydroxypropyl)-2-methylimidazole, 1-(2'-hydroxyethyl)imidazole, 1-(2'-hydroxyethyl)-2-methylimidazole, 1-(2'-hydroxypropyl)-2-methylimidazole, 1-(3'-aminopropyl)imidazole, 1-(3'-aminopropyl)-2-methylimidazole, 1-(3'-hydroxypropyl)imidazole, 1-(3'-hydroxypropyl)-2-methylimidazole, N,N-dimethylaminopropyl-N'-(2-hydroxyethyl)amine, N,N-dimethylaminopropyl-N',N'-bis(2-hydroxyethyl)amine, N,N-dimethylaminopropyl-N',N'-bis(2-hydroxypropyl)amine, N,N-dimethylaminoethyl-N',N'-bis(2-hydroxyethyl)amine, N,N-dimethylaminoethyl-N',N'-bis(2-hydroxypropyl)amine, melamine or/and benzoguanamine, etc. may be cited.

As the amine salt mentioned above, organic acid salt-based amine salts, for example, DBU (1,8-diaza-bicyclo[5.4.0]undecene-7) may be cited.

The amount of the above-mentioned catalyst for urethanization to be incorporated in the composition may be sufficient in the conventionally used range, for example, preferably in the range of 0.1 to 20 parts by weight, more preferably 0.5 to 10.0 parts by weight, based on 100 parts by weight of the carboxyl group-containing urethane resin mentioned above.

When the thermosetting component having a plurality of cyclic (thio)ether groups in its molecule is used, it is preferable that the composition should contain a thermosetting catalyst. As such thermosetting catalysts, for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine; hydrazine compounds such as dihydrazide adipate and dihydrazide sebacate; and phosphorus compounds such as triphenylphosphine may be cited. As the commercially available thermosetting catalysts, for example, products of Shikoku Chemicals Co., Ltd.; 2MZ-A, 2MZ-OK, 2PHZ, 2P4BHZ, and 2P4 MHZ (invariably trade names for imidazole type compounds), and products of Sun-Apro K.K.; U-CAT (registered trademark) 3503N and U-CAT3502T (invariably trade names for isocyanate compounds blocked with dimethyl amine) and DBU, DBN, U-CATSA102, and U-CAT5002 (invariably trade names for dicyclic amizine compounds and salts thereof) may be cited. The thermosetting catalyst is not limited to the compounds cited above. Any thermosetting catalysts for an epoxy resin and an oxetane compound or any compounds which can promote the reaction of an epoxy group and/or an oxetanyl group with a carboxyl group may be used either singly or in the form of a mixture of two or more members. Furthermore, S-triazine derivatives such as guanamine, acetoguanamine, benzoguanamine, melamine, 2,4-diamino-6-methacryloyloxyethyl-5-triazine, 2-vinyl-4,6-diamino-5-triazine, isocyanuric acid adduct of 2-vinyl-4,6-diamino-5-triazine, isocyanuric acid adduct of 2,4-diamino-6-methacryloyloxyethyl-5-triazine may also be used. Preferably, these compounds which also function as an adhesiveness-imparting agent are used in combination with the thermosetting catalyst mentioned above.

The amount of the thermosetting catalyst to be incorporated in the composition may be sufficient in the conventionally used range, for example, preferably in the range of 0.1 to 20 parts by weight, more preferably 0.5 to 15.0 parts by weight, based on 100 parts by weight of the above-mentioned carboxyl group-containing urethane resin or the thermosetting component having a plurality of cyclic (thio)ether groups in its molecule.

The photosensitive resin composition of the present invention may incorporate a colorant therein. As the colorant, known and commonly used coloring agents of red, blue, green, yellow, etc. may be used and any of pigments, dyes and dyestuff may be sufficient. As concrete examples, those having the following Color Index (C.I.; issued by The Society of Dyers and Colourists) numbers may be cited. However, it is preferred that they do not contain halogen from the viewpoint of reducing impact on the environment and influence on the human body.

Red Colorant:

As the red colorant, there are a monoazo type, a disazo type, an azo rake type, a benzimidazolone type, a perylene type, a diketo-pyrrolo-pyrrole type, a condensation azo type, an anthraquinone type, a quinacridone type, etc. As concrete examples, the following colorants may be cited.

Monoazo type: Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, and 269.

Disazo type: Pigment Red 37, 38, and 41.

Monoazo rake type: Pigment Red 48:1, 48:2, 48:3, 48:4, 49:1, 49:2, 50:1, 52:1, 52:2, 53:1, 53:2, 57:1, 58:4, 63:1, 63:2, 64:1, and 68.

Benzimidazolone type: Pigment Red 171, Pigment Red 175, Pigment Red 176, Pigment Red 185, and Pigment Red 208.

Perylene type: Solvent Red 135, Solvent Red 179, Pigment Red 123, Pigment Red 149, Pigment Red 166, Pigment Red 178, Pigment Red 179, Pigment Red 190, Pigment Red 194, and Pigment Red 224.

Diketo-pyrrolo-pyrrole type: Pigment Red 254, Pigment Red 255, Pigment Red 264, Pigment Red 270, and Pigment Red 272.

Condensation azo type: Pigment Red 220, Pigment Red 144, Pigment Red 166, Pigment Red 214, Pigment Red 220, Pigment Red 221, and Pigment Red 242.

Anthraquinone type: Pigment Red 168, Pigment Red 177, Pigment Red 216, Solvent Red 149, Solvent Red 150, Solvent Red 52, and Solvent Red 207.

Quinacridone type: Pigment Red 122, Pigment Red 202, Pigment Red 206, Pigment Red 207, and Pigment Red 209.

Blue Colorant:

As the blue colorant, there are a phthalocyanine type and an anthraquinone type. As the pigment type thereof, the compounds which are classified into a pigment, concretely, Pigment Blue 15, Pigment Blue 15:1, Pigment Blue 15:2, Pigment Blue 15:3, Pigment Blue 15:4, Pigment Blue 15:6, Pigment Blue 16, and Pigment Blue 60 may be used.

As the dye type, Solvent Blue 35, Solvent Blue 63, Solvent Blue 68, Solvent Blue 70, Solvent Blue 83, Solvent Blue 87, Solvent Blue 94, Solvent Blue 97, Solvent Blue 122, Solvent Blue 136, Solvent Blue 67, Solvent Blue 70, etc. may be used. Besides the compounds mentioned above, a phthalocyanine compound which is substituted or not substituted by metal may also be used.

Green Colorant:

As the green colorant, similarly there are a phthalocyanine type, an anthraquinone type, and a perylene type. Specifically, Pigment Green 7, Pigment Green 36, Solvent Green 3, Solvent Green 5, Solvent Green 20, Solvent Green 28, etc. may be used. Besides the compounds mentioned above, a phthalocyanine compound which is substituted or not substituted by metal may also be used.

Yellow Colorant:

As the yellow colorant, there are a monoazo type, a disazo type, a condensation azo type, a benzimidazolone type, an isoindolinone type, an anthraquinone type, etc., and the following are specifically cited.

Anthraquinone type: Solvent Yellow 163, Pigment Yellow 24, Pigment Yellow 108, Pigment Yellow 193, Pigment Yellow 147, Pigment Yellow 199, and Pigment Yellow 202.

Isoindolinone type: Pigment Yellow 110, Pigment Yellow 109, Pigment Yellow 139, Pigment Yellow 179, and Pigment Yellow 185.

Condensation azo type: Pigment Yellow 93, Pigment Yellow 94, Pigment Yellow 95, Pigment Yellow 128, Pigment Yellow 155, Pigment Yellow 166, and Pigment Yellow 180.

Benzimidazolone type: Pigment Yellow 120, Pigment Yellow 151, Pigment Yellow 154, Pigment Yellow 156, Pigment Yellow 175, and Pigment Yellow 181.

Monoazo type: Pigment Yellow 1, 2, 3, 4, 5, 6, 9, 10, 12, 61, 62, 62:1, 65, 73, 74, 75, 97, 100, 104, 105, 111, 116, 167, 168, 169, 182, and 183.

Disazo type: Pigment Yellow 12, 13, 14, 16, 17, 55, 63, 81, 83, 87, 126, 127, 152, 170, 172, 174, 176, 188, and 198.

In addition, any coloring agents of purple, orange, brown, black, etc. may be added to the composition for the purpose of adjusting a color tone.

As concrete examples thereof, Pigment Violet 19, 23, 29, 32, 36, 38, and 42, Solvent Violet 13 and 36, C.I. Pigment Orange 1, C.I. Pigment Orange 5, C.I. Pigment Orange 13, C.I. Pigment Orange 14, C.I. Pigment Orange 16, C.I. Pigment Orange 17, C.I. Pigment Orange 24, C.I. Pigment Orange 34, C.I. Pigment Orange 36, C.I. Pigment Orange 38, C.I. Pigment Orange 40, C.I. Pigment Orange 43, C.I. Pigment Orange 46, C.I. Pigment Orange 49, C.I. Pigment Orange 51, C.I. Pigment Orange 61, C.I. Pigment Orange 63, C.I. Pigment Orange 64, C.I. Pigment Orange 71, C.I. Pigment Orange 73, C.I. Pigment Brown 23, C.I. Pigment Brown 25, C.I. Pigment Black 1, C.I. Pigment Black 7, etc. may be cited.

The amount of the above-mentioned colorant to be incorporated in the composition is not limited to a particular range, but it is preferred to be in the range of 0 to 10 parts by weight, more preferably 0.1 to 5 parts by weight, based on 100 parts by weight of the aforementioned carboxyl group-containing urethane resin.

The photosensitive resin composition of the present invention may contain a compound which has a plurality of ethylenically unsaturated groups in its molecule. This compound is capable of curing by irradiation with an active energy ray and insolubilizing the above-mentioned carboxyl group-containing urethane resin in an aqueous alkali solution or assisting the insolubilization. As such compounds, commonly used and known polyester (meth)acrylates, polyether (meth)acrylates, urethane (meth)acrylates, carbonate (meth)acrylates, epoxy (meth)acrylates, etc., may be used. As concrete examples thereof, hydroxyalkyl acrylates such as 2-hydroxyethyl acrylate and 2-hydroxypropyl acrylate; di-acrylates of glycols such as ethylene glycol, methoxytetraethylene glycol, polyethylene glycol, and propylene glycol; acrylamides such as N,N-dimethyl acrylamide, N-methylol acrylamide, and N,N-dimethylaminopropyl acrylamide; aminoalkyl acrylates such as N,N-dimethylaminoethyl acrylate and N,N-dimethylaminopropyl acrylate; polyfunctional acrylates of polyhydric alcohols, such as hexane diol, trimethylol propane, pentaerythritol, dipentaerythritol, and tris-hydroxyethyl isocyanurate, and ethylene oxide adducts, propylene oxide adducts or ε-caprolactone adducts of these polyhydric alcohols; polyfunctional acrylates of phenols and ethylene oxide adducts or propylene oxide adducts of phenols such as phenoxy acrylate and bisphenol A diacrylate; polyfunctional acrylates of glycidyl ethers such as glycerin diglycidyl ether, glycerin triglycidyl ether, trimethylol propane triglycidyl ether, and triglycidyl isocyanurate; acrylates obtained by directly acrylating or urethane-acrylating via a diisocyanate a polyol such as polyether polyol, polycarbonatediol, hydroxyl group-terminated polybutadiene, and polyester polyol; melamine acrylate, and/or methacrylates corresponding to the acrylates enumerated above may be cited.

Further, an epoxy acrylate resin obtained by the reaction of a polyfunctional epoxy resin such as a cresol novolak type epoxy resin with acrylic acid, an epoxy urethane acrylate compound obtained by causing a half urethane compound of a hydroxyl acrylate such as pentaerythritol triacrylate and a diisocyanate such as isophorone diisocyanate to react with the hydroxyl group of the epoxy acrylate resin mentioned above, or the like may be cited. Such an epoxy acrylate type resin is capable of improving the photo-curing properties, without deteriorating the tack-free touch of finger of a dried coating film.

Particularly, in the present invention the polyfunctional acrylates of polyhydric alcohols or ethylene oxide adducts, propylene oxide adducts or ε-caprolactone adducts of the polyhydric alcohols, the polyfunctional acrylates of ethylene oxide adducts or propylene oxide adducts of phenols, and (meth)acrylate-containing urethane oligomers can be advantageously used from the viewpoint of the improvement in reduction of warpage and bending characteristics.

The amount of such a compound having a plurality of ethylenically unsaturated groups in its molecule to be incorporated in the composition is desired to be in the range of 5 to 100 parts by weight, preferably 5 to 70 parts by weight, based on 100 parts by weight of the carboxyl group-containing urethane resin mentioned above. If the amount of the compound is less than 5 parts by weight based on 100 parts by weight of the above-mentioned carboxyl group-containing urethane resin, undesirably the photo-curing properties of the resultant photosensitive resin composition will become inferior, and after irradiation with an active energy ray, it will be difficult to complete the pattern formation with an alkali development. Conversely, if the amount exceeds 100 parts by weight, undesirably the solubility of the composition in an aqueous alkaline solution will become inferior and a coating film will become brittle.

The photosensitive resin composition of the present invention may further incorporate a filler therein, as occasion demands, in order to increase the physical strength of a coating film. As such a filler, any known and commonly used inorganic or organic fillers may be used. Particularly, barium sulfate, spherical silica, and talc may be advantageously used. Further, a metal oxide, such as titanium oxide, and a metal hydroxide may also be used as an extender pigment filler in order to impart white appearance and flame retardancy to a coating film. The amount of the filler to be incorporated in the composition is desired to be not more than 300 parts by weight, preferably in the range of 0.1 to 200 parts by weight, more preferably 1 to 100 parts by weight, based on 100 parts by weight of the carboxyl group-containing urethane resin mentioned above. If the amount of the filler exceeds 300 parts by weight based on 100 parts by weight of the above-mentioned carboxyl group-containing urethane resin, undesirably the viscosity of the composition will become high, the printability of the composition will become inferior, and the cured product will become brittle.

Further, a binder polymer may be used for the photosensitive resin composition of the present invention for the purpose of improving the tack-free touch of finger of a dried coating film, handling characteristics thereof, etc. For example, a polyester type polymer, a polyurethane type polymer, a polyester urethane type polymer, a polyamide type polymer, a polyester amide type polymer, an acrylic polymer, a cellulose type polymer, a polylactic acid type polymer, a phenoxy type polymer, etc. may be used. These binder polymers may be used either singly or in the form of a mixture of two or more members.

Furthermore, other elastomers may be used for the photosensitive resin composition of the present invention for the purpose of imparting flexibility to and improving brittleness of a cured product. For example, a polyester type elastomer, a polyurethane type elastomer, a polyester urethane type elastomer, a polyamide type elastomer, a polyester amide type elastomer, an acrylic elastomer, an olefin type elastomer, etc. may be used. Any resins obtained by modifying part or the whole of the epoxy groups of the epoxy resins having various skeletons with a butadiene-acrylonitrile rubber of which both ends are modified to carboxyl groups may also be used. Moreover, an epoxy group-containing polybutadiene type elastomer, an acryloyl group-containing polybutadiene type elastomer, a hydroxyl group-containing polybutadiene type elastomer, a hydroxyl group-containing isoprene type elastomer, etc. may also be used. These elastomers may be used either singly or in the form of a mixture of two or more members.

The photosensitive resin composition of the present invention may use an organic solvent for the synthesis of the above-mentioned carboxyl group-containing urethane resin or preparation of the composition or for the purpose of adjusting the viscosity of the composition to a level suitable for application to a substrate or a carrier film.

As such organic solvents, for example, ketones, aromatic hydrocarbons, glycol ethers, glycol ether acetates, esters, alcohols, aliphatic hydrocarbons, and petroleum solvents may be cited. As concrete examples thereof, ketones such as methylethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, dipropylene glycol methyl ether acetate, propylene glycol methyl ether acetate, propylene glycol ethyl ether acetate, and propylene glycol butyl ether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited. These organic solvents may be used either singly or in the form of a mixture of two or more members.

Generally, in many macromolecular materials, once the oxidation thereof starts, the chain oxidation degradation will generate successively, thereby giving birth to the reduction in function of the macromolecular raw material. Accordingly, for the purpose of preventing oxidation, antioxidants, such as a radical scavenger which can nullify the generated radicals or/and a peroxide decomposer which decomposes the generated peroxides into a harmless substance and inhibits the generation of new radicals, may be added to the photosensitive resin composition of the present invention. Particularly, if the antioxidant is used for the composition which uses a butadiene-based elastomer as in the present invention, it is so effective that the PCT resistance is improved and peeling and discoloration of a coating film will occur scarcely at the time of the HAST treatment.

As concrete compounds of the antioxidant which functions as a radical scavenger, phenol-based compounds, such as hydroquinone, 4-t-butyl catechol, 2-t-butylhydroquinone, hydroquinone monomethyl ether, 2,6-di-t-butyl-p-cresol, 2,2-methylene-bis(4-methyl-6-t-butylphenol), 1,1,3-tris(2-methyl-4-hydroxy-5-t-buthylphenyl)butane, 1,3,5-trimethyl-2,4,6-tris(3,5-di-t-butyl-4-hydroxybenzyl)benzene, and 1,3,5-tris(3',5'-di-t-butyl-4-hydroxybenzyl)-S-triazine-2,4,6-(1H,3H,5H)trione, quinine-based compounds, such as metaquinone and benzoquinone, and amine compounds, such as bis(2,2,6,6-tetramethyl-4-piperidyl)-sebacate and phenothiazin, etc. may be cited.

The radical scavenger may be commercially available products and, for example, ADEKA STAB (registered trademark) AO-30, ADEKA STAB AO-330, ADEKA STAB AO-20, ADEKA STAB LA-77, ADEKA STAB LA-57, ADEKA STAB LA-67, ADEKA STAB LA-68, and ADEKA STAB LA-87 (all trade names for the products manufactured by ADEKA Corporation), IRGANOX (registered trademark) 1010, IRGANOX 1035, IRGANOX 1076, IRGANOX 1135, TINUVIN (registered trademark) 111FDL, TINUVIN 123, TINUVIN 144, TINUVIN 152, TINUVIN 292, and TINUVIN 5100 (all trade names for the products manufactured by Ciba Japan Ltd.), etc. may be cited.

As concrete compounds of the antioxidant which functions as a peroxide decomposer, sulfur-based compounds such as triphenyl phosphite, and phosphorus-based compounds such as pentaerythritol tetralaurylthiopropionate, dilauryl thiodipropionate, distearyl 3,3'-thiodipropionate, etc. may be cited.

The peroxide decomposer may be commercially available products and, for example, ADEKA STAB TPP (trade name for the product manufactured by ADEKA Corporation), MARK AO-412S (trade name for the product manufactured by Adeka Argus Chemical Co., Ltd.), SUMILIZER (registered trademark) TPS (trade name for the product manufactured by Sumitomo Chemical Co., Ltd.), etc. may be cited.

The antioxidants mentioned above may be used either singly or in the form of a combination of two or more members.

Further, in general a macromolecular material absorbs light and thereby causes decomposition and degradation. Accordingly, in the photosensitive resin composition of the present invention an ultraviolet light absorber other than the above-mentioned antioxidant may be used for the purpose of performing the stabilization measure to ultraviolet light.

As the ultraviolet light absorber, benzophenone derivatives, benzoate derivatives, benzotriazole derivatives, triazine derivatives, benzothiazole derivatives, cinnamate derivatives, anthranilate derivatives, dibenzoylmethane derivatives, etc. may be cited. As concrete examples of the benzophenone derivatives, 2-hydroxy-4-methoxybenzophenone, 2-hydroxy-4-n-octoxybenzophenone, 2,2'-dihydroxy-4-methoxybenzophenone, 2,4-dihydroxybenzophenone, etc. may be cited. As concrete examples of the benzoate derivatives, 2-ethylhexyl salicylate, phenyl salicylate, p-t-butylphenyl salicylate, 2,4-di-t-buthylphenyl-3,5-di-t-butyl-4-hydroxy benzoate, hexadecyl-3,5-di-t-butyl-4-hydroxy benzoate, etc. may be cited. As concrete examples of the benzotriazole derivatives, 2-(2'-hydroxy-5'-t-buthylphenyl)benzotriazol, 2-(2'-hydroxy-5'-methylphenyl)benzotriazol, 2-(2'-hydroxy-3'-t-butyl-5'-methylphenyl)-5-chlorobenzotriazole, 2-(2'-hydroxy-3',5'-di-t-buthylphenyl)-5-chlorobenzotriazole, 2-(2'-hydroxy-5'-methylphenyl)benzotriazol, 2-(2'-hydroxy-3',5'-di-t-amylphenyl)benzotriazol, etc. may be cited. As concrete examples of the triazine derivatives, hydroxyphenyl triazine, bisethylhexyloxyphenol methoxypheny triazine, etc. may be cited.

The ultraviolet light absorber may be commercial available products, and for example, TINUVIN PS, TINUVIN 99-2, TINUVIN. 109, TINUVIN 384-2, TINUVIN 900, TINUVIN 928, TINUVIN 1130, TINUVIN 400, TINUVIN 405, TINUVIN 460, TINUVIN 479 (all trade names for the products manufactured by Ciba Japan Ltd.), etc. may be cited.

The above-mentioned ultraviolet light absorbers may be used either singly or in the form of a combination of two or more members to stabilize the molded product obtained from the photosensitive resin composition of the present invention by using together with the aforementioned antioxidant.

The photosensitive resin composition of the present invention may use a known and commonly used N-phenylglycines, phenoxyacetic acids, thiophenoxyacetic acids, mercaptothiazole, etc. as a chain transfer agent for the purpose of improving the sensitivity. As concrete examples of the chain transfer agent, for example, chain transfer agents having a carboxyl group, such as mercaptosuccinic acid, mercaptoacetic acid, mercaptopropionic acid, methionine, cysteine, thiosalicylic acid, and derivatives thereof; chain transfer agents having a hydroxyl group, such as mercaptoethanol, mercaptopropanol, mercaptobutanol, mercaptopropanediol, mercaptobutanediol, hydroxy benzenethiol, and derivatives thereof; 1-butanethiol, butyl-3-mercaptopropionate, methyl-3-mercaptopropionate, 2,2-(ethylenedioxy)diethanethiol, ethanethiol, 4-methylbenzene thiol, dodecyl mercaptan, propanethiol, butanethiol, pentanethiol, 1-octanethiol, cyclopentanethiol, cyclohexanethiol, thioglycerol, 4,4-thiobisbenzenethiol etc. may be cited.

A polyfunctional mercaptan-based compound may also be used. Although it is not limited to a particular one, for example, aliphatic thiols, such as hexane-1,6-dithiol, decane-1,10-dithiol, dimercaptodiethylether, and a dimercaptodiethylsulfide; aromatic thiols, such as xylylene dimercaptan, 4,4'-dimercaptodiphenylsulfide, and 1,4-benzene dithiol; poly (mercaptoacetate) of polyhydric alcohol, such as ethylene glycol bis(mercaptoacetate), polyethylene glycol bis(mercaptoacetate), propylene glycol bis(mercaptoacetate), glycerol tris(mercaptoacetate), trimethylolethane tris(mercaptoacetate), trimethylolpropane tris(mercaptoacetate), pentaerythritol tetrakis(mercaptoacetate), and dipentaerythritol hexakis(mercaptoacetate)); poly(3-mercaptopropionate) of polyhydric alcohol, such as ethylene glycol bis(3-mercaptopropionate), polyethylene glycol bis(3-mercaptopropionate), propylene glycol bis(3-mercaptopropionate), glycerol tris(3-mercaptopropionate), trimethylolethane tris(mercaptopropionate), trimethylolpropane tris(3-mercaptopropionate), pentaerythritol tetrakis(3-mercaptopropionate), and dipentaerythritol hexakis(3-mercaptopropionate); and poly(mercaptobutyrate), such as 1,4-bis(3-mercaptobutyryloxy)butane, 1,3,5-tris(3-mercaptobutyloxyethyl)-1,3,5-triazine-2,4,6(1H,3H,5H)-trione, and pentaerythritol tetrakis(3-mercaptobutyrate) may be cited.

As the commercially available products thereof, for example BMPA, MPM, EHMP, NOMP, MBMP, STMP, TMMP, PEMP, DPMP and TEMPIC (all manufactured by Sakai Chemical Industry Co., Ltd.), Karenz (registered trademark) MT-PE1, Karenz MT-BD1, and Karenz NR1 (all manufactured by Showa Denko K.K.), etc. may be cited.

Further, as a heterocyclic compound having a mercapto group, which functions as a chain transfer agent, for example, mercapto-4-butyrolactone (alias: 2-mercapto-4-butanorido), 2-mercapto-4-methyl-4-butyrolactone, 2-mercapto-4-butyrolactam, N-methoxy-2-mercapto-4-butyrolactam, N-ethoxy-2-mercapto-4-butyrolactam, N-methyl-2-mercapto-4-butyrolactam, N-ethyl-2-mercapto-4-butyrolactam, N-(2-methoxy)ethyl-2-mercapto-4-butyrolactam, N-(2-ethoxy)ethyl-2-mercapto-4-butyrolactam, 2-mercapto-5-valerolactone, 2-mercapto-5-valerolactam, N-methyl-2-mercapto-5-valerolactam, N-ethyl-2-mercapto-5-valerolactam, N-(2-methoxy)ethyl-2-mercapto-5-valerolactam, N-(2-ethoxy)ethyl-2-mercapto-5-valerolactam, 2-mercaptobenzothiazole, 2-mercapto-5-methylthiothiadiazole, 2-mercapto-6-hexanolactam, 2,4,6-trimercapto-s-triazine (trade name, Zisnet F manufactured by SANKYO KASEI Co., Ltd.), 2-dibutylamino-4,6-dimercapto-s-triazine (trade name, Zisnet DB manufactured by SANKYO KASEI Co., Ltd.), 2-anilino-4,6-dimercapto-s-triazine (trade name, Zisnet AF manufactured by SANKYO KASEI Co., Ltd.), etc. may be cited.

Particularly, as a heterocyclic compound having a mercapto group, which is a chain transfer agent that will not impair the developability of a photosensitive resin composition, mercaptobenzothiazole, 3-mercapto-4-methyl-4H-1,2,4-triazole, 5-methyl-1,3,4-thiadiazole-2-thiol, and 1-phenyl-5-mercapto-1H-tetrazole prove to be desirable. These chain transfer agents may be used either singly or in the form of a combination of two or more members.

In the photosensitive resin composition of the present invention, an adhesiveness-imparting agent may be used for the purpose of improving the adhesion between layers or the adhesion between a photosensitive resin layer and a substrate. As concrete examples thereof, for example, benzimidazole, benzoxazole, benzothiazole, 2-mercaptobenzimidazole, 2-mercaptobenzoxazole, 2-mercaptobenzothiazole (trade name: Accel M manufactured by Kawaguchi Chemical Industry Co., Ltd.), 3-morpholinomethyl-1-phenyl-triazole-2-thione, 5-amino-3-morpholinomethyl-thiazole-2-thione, 2-mercapto-5-methylthiothiadiazole, triazole, tetrazole, benzotriazol, carboxybenzotriazol, amino group-containing benzotriazol, silane coupling agent, etc. may be cited.

The photosensitive resin composition of the present invention may further incorporate therein, as occasion demands, a thixotropic agent, such as finely powdered silica, organobentonite, montmorillonite, and hydrotalcite. The organobentonite and hydrotalcite prove to be preferable from the view point of the stability with time, and particularly hydrotalcite excels in electrical properties. Further, any known and commonly used additives such as a thermal polymerization inhibitor, a silicone type, fluorine type, or macromolecular type anti-foaming agent and/or leveling agent, a silane coupling agent of the imidazole type, thiazole type, triazole type, etc., a rust preventive, and a copper deactivator of the bisphenol type, triazine thiol type, etc. may be incorporated into the composition.

The thermal polymerization inhibitor mentioned above can be used for the purpose of preventing the thermal polymerization or the polymerization with time of the aforementioned polymerizable compound. As the thermal polymerization inhibitor, for example 4-methoxyphenol, hydroquinone, alkyl- or aryl-substituted hydroquinone, t-butylcatechol, pyrogallol, 2-hydroxybenzophenone, 4-methoxy-2-hydroxybenzophenone, cuprous chloride, phenothiazin, chloranil, naphthylamine, β-naphthol, 2,6-di-t-butyl-4-cresol, 2,2'-methylenebis(4-methyl-6-t-butylphenol), pyridine, nitrobenzene, dinitrobenzene, picric acid, 4-toluidine, methylene blue, a reaction product of copper and an organic-chelating agent, methyl salicylate, phenothiazin, a nitroso compound, a chelate of a nitroso compound and aluminum, etc. may be cited.

The photosensitive resin composition of the present invention is adjusted to a level of viscosity suitable for a particular coating method by adding an organic solvent mentioned above, for example, applied to a substrate by the technique of a dip coating method, a flow coating method, a roll coating method, a bar coater method, a screen printing method, a curtain coating method, or the like, and then dried (pre-dried) at a temperature in the approximate range of 60-100° C. to expel by evaporation the organic solvent contained in the composition to produce a tack-free coating film. Thereafter, the coating film is exposed to light by selectively exposing to an active energy ray through a photomask having a prescribed exposure pattern by a contact method (or a non-contact method) or directly exposed according to a prescribed pattern with a laser direct exposure machine. The unexposed area of the coating film is developed with an aqueous alkali solution (for example, an aqueous 0.3-3% sodium carbonate solution) to form a resist pattern. In the case of the composition containing a thermosetting component, when the resultant resist film is further thermally cured by heating to a temperature of about 140-180° C., for example, the carboxyl group of the carboxyl group-containing urethane resin mentioned above reacts with the thermosetting component having a plurality of cyclic ether groups and/or cyclic thioether groups in its molecule, and thus a cured film which excels in various properties such as resistance to heat, resistance to chemicals, resistance to moisture absorption, adhesiveness, and electrical properties can be obtained. Incidentally, even when the composition does not contain a thermosetting component, the ethylenically unsaturated bond of the photocurable component which remained in the unreacted state at the time of exposure to light will cause the thermal radical-polymerization by a heat treatment, thereby improving the properties of a coating film. Accordingly, the coating film may be subjected to a heat treatment (thermal curing) depending on the purpose and the use thereof.

As the substrate mentioned above, besides printed wiring boards having a prescribed pattern formed in advance thereon and flexible printed wiring boards, copper-clad laminates of all grades (FR-4 etc.) using composite materials, such as a paper-phenol resin composite material, a paper-epoxy resin composite material, a glass cloth-epoxy resin composite material, a glass-polyimide composite material, a glass cloth/nonwoven fabric-epoxy resin composite material, a glass cloth/paper-epoxy resin composite material, a synthetic fiber-epoxy resin composite material, and a fluoroplastic-polyethylene-PPO-cyanate ester composite material, and a polyimide film, a PET film, a glass substrate, a ceramic substrate, a wafer substrate, etc. may be used.

The drying by evaporation of the photosensitive resin composition of the present invention to be done after applied to a substrate may be performed by the use of a hot air circulating drying oven, an IR oven (infrared heating oven), a hot plate, a convection oven, or the like (a method of contacting the hot air flowing in the counter direction or blowing the hot air through a nozzle onto a substrate in a drying machine equipped with a heat source of an air heating system with steam).

After the photosensitive resin composition of the present invention is applied to a substrate and dried by evaporation of the organic solvent contained in the composition as described above, the resultant coating film is exposed to light (irradiated with an active energy ray). The exposed area (the area irradiated with the active energy ray) of the coating film cures.

As an exposure machine to be used for irradiation with the active energy ray mentioned above, direct imaging equipment (for example, laser direct imaging equipment which depicts an image directly by a laser with the CAD data from a computer), an exposure machine equipped with metal halide lamp(s), an exposure machine equipped with (ultra)high-pressure mercury vapor lamp(s), an exposure machine equipped with mercury short arc lamp(s), or direct imaging equipment equipped with ultraviolet light lamp(s) such as (ultra)high-pressure mercury vapor lamp(s) may be used. As the activity energy ray, either of a gas laser and a solid-state laser may be used insofar as the laser beam having a maximum wavelength falling in the range of 350 nm to 410 nm is used. Although the exposure dose varies depending on the film thickness etc., it may be set generally in the range of 5 to 300 mJ/cm$^2$, preferably 5 to 200 mJ/cm$^2$. As the above-mentioned direct imaging equipment, the products manufactured by Orbotech Japan Co., Ltd. or PENTAX CORPORATION, for example, may be used. Any equipment may be used insofar as it can emit the laser beam having the maximum wavelength in the range of 350 nm to 410 nm.

As a developing method mentioned above, a dipping method, a shower method, a spraying method, a brushing method or the like may be adopted. As a developing solution, aqueous alkali solutions of potassium hydroxide, sodium hydroxide, sodium carbonate, potassium carbonate, sodium phosphate, sodium silicate, ammonia, amines, etc. may be used.

Besides being applied in the liquid state directly to a substrate, the photosensitive resin composition of the present invention may also be used in the state of a dry film having a solder resist layer formed in advance by applying a solder resist of the composition on a film of polyethylene terephthalate etc. and drying it. The use of the photosensitive resin composition of the present invention as a dry film will be described below.

A dry film has the structure comprising a carrier film, a solder resist layer, and a strippable cover film that is used if needed, laminated in the order mentioned above. The solder resist layer is a layer obtained by applying the alkali-developable photosensitive resin composition onto the carrier film or the cover film and drying it. The dry film is obtained by forming the solder resist layer on the carrier film and then laminating the cover film thereon, or by forming the solder resist layer on the cover film and then laminating this laminated product on the carrier film.

As the carrier film, a thermoplastic film, such as a polyester film of 2-150 μm thickness, is used.

The solder resist layer is formed by applying the alkali-developable photosensitive resin composition to the carrier film or the cover film so as to be a uniform thickness of 10-150 μm by the use of a blade coater, a lip coater, a comma coater, a film coater, etc. and then drying it.

As the cover film, a polyethylene film, a polypropylene film, etc. can be used, but any cover film may be advantageously used provided that its adhesive strength to the solder resist layer is smaller than that of the carrier film to the solder resist layer.

When a protective film (a permanent protective film) is formed on a printed wiring board by the use of the dry film, a solder resist layer is formed on a substrate having a circuit formed in advance thereon by removing the cover film from the dry film, superposing the solder resist layer on the circuit-formed surface of the substrate and laminating them by means of a laminator or the like. A cured film may be formed by subjecting the formed solder resist layer to the exposure to light, the development and the thermal curing in the same manner as mentioned above. The carrier film may be separated therefrom either before or after the exposure to light.

Now, the present invention will be more specifically described below with reference to working examples and comparative examples. However, it is needless to say that the present invention is not limited to the following examples. Wherever "parts" and "%" are mentioned hereinbelow, they invariably refer to those based on weight unless otherwise specified.

Synthesis Example 1

Into a flask equipped with a stirrer and a reflux tube, 300.0 g of NC-3000 manufactured by Nippon Kayaku Co., Ltd. (epoxy equivalent: 255 g/eq.) as an epoxy resin having a plurality of epoxy groups in its molecule, 84.7 g of acrylic acid as a monocarboxylic acid having an ethylenically unsaturated group in its molecule, 1.8 g of 2,6-ditertiary-butyl-4-methyl phenol as a thermal polymerization inhibitor, 1.8 g of triphenylphosphine as a reaction catalyst, and 207.2 g of propylene glycol monomethyl ether acetate (PGMEA) as a reaction solvent were charged and left reacting at a reaction temperature of 98° C. till the acid value of the reaction solution reaches 1 mg KOH/g or less to obtain a hydroxyl group-containing epoxy carboxylate compound.

Next, 335.5 g of the resultant reaction solution containing the hydroxyl group-containing epoxy carboxylate compound, 60.7 g of dimethylolbutyric acid as a carboxyl group-containing diol compound, 104.1 g of 2,4,4-trimethyl hexamethylene diisocyanate as an aliphatic diisocyanate compound, and 88.7 g of PGMEA as a reaction solvent were charged into the flask and left reacting at a reaction temperature of 80° C. The reaction was followed up by the NCO content and the point reached 0.1% or less was regarded as the completion of the reaction. The carboxyl group-containing urethane resin having a biphenyl skeleton consequently obtained was found to have an acid value of 60 mg KOH/g as 65% solid content resin (hereinafter referred to as "varnish 1").

Varnish 2:
A carboxyl group-containing resin used for comparative example 1 is a carboxyl group-containing photosensitive resin, which used a polyfunctional epoxy of bisphenol F structure containing photosensitive groups therein, ZFR-1124 manufactured by Nippon Kayaku Co., Ltd. (solid content: 63%, acid value as resin: 102 mg KOH/g).

Varnish 3:
A carboxyl group-containing resin used for comparative example 2 is a carboxyl group-containing photosensitive resin, which used a polyfunctional epoxy of bisphenol structure containing photosensitive groups therein, ZCR-1601 manufactured by Nippon Kayaku Co., Ltd. (solid content: 65%, acid value as resin: 98 mg KOH/g).

Varnish 4:
A carboxyl group-containing resin used for comparative example 3 is a carboxyl group-containing photosensitive resin of urethane structure containing photosensitive groups therein, P7B-53 manufactured by Kyoeisha Chemical Co., Ltd. (solid content: 53%, acid value as resin: 49 mg KOH/g).

Preparation of Aluminum Hydroxide Slurry:
700 g of aluminum hydroxide (HIGILITE 42M manufactured by Showa Denko K.K.) was mixed and stirred with 295 g of carbitol acetate as a solvent and 5 g of a wetting dispersant, and a dispersing treatment was carried out in a bead mill using 0.5 μm zirconia beads. Aluminum hydroxide slurry was prepared by repeating this treatment 3 times and passing the dispersed mixture through a filter of 3 μm.

Preparation of Silica Slurry:
700 g of micro-spherical silica (SO-E2 manufactured by the Admatech Co., Ltd.) was mixed and stirred with 295 g of carbitol acetate as a solvent and 5 g of a vinylsilane coupling agent as a silane coupling agent, and a dispersing treatment was carried out in the same manner as described above in a bead mill. Silica slurry was prepared by repeating this treatment 3 times and passing the dispersed mixture through a filter of 3 μm.

Examples 1 to 14 and Comparative Examples 1 to 3

By using the resin solution obtained in the synthesis example mentioned above, the components shown in Table 1 and Table 2 accounting for varying ratios (in parts by weight) of combination shown in Table 1 and Table 2 were compounded, preliminarily mixed with an agitator, and then kneaded with a three-roll mill to obtain photosensitive resin compositions for a solder resist. The degree of dispersion of particles in each resultant photosensitive resin composition determined by the grain size measurement with a grindometer manufactured by ERICHSEN GmbH was not more than 15 μm

TABLE 1

| Components (parts by weight) | | Examples | | | | | | | | | | | | | |
|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 |
| Carboxyl group-containing resin | Varnish 1 | 154 | 154 | 107 | 154 | 154 | 154 | 154 | 154 | 154 | 154 | 154 | 154 | 154 | 154 |
| | Varnish 2 | | | | | | | | | | | | | | |
| | Varnish 3 | | | 47 | | | | | | | | | | | |
| | Varnish 4 | | | | | | | | | | | | | | |
| Photo-polymerization initiator | TPO*1 | 10 | 10 | 10 | 10 | 10 | | 7 | 7 | 10 | 10 | | 15 | 10 | 10 |
| | 907*2 | | | | | | 10 | 3 | 3 | | | | | | |
| | OXE-02*3 | 1.5 | 1.5 | 1.5 | 1.5 | 1.5 | 1.5 | 1.5 | 1.5 | | 1.0 | | | | |
| | NCI-831*4 | | | | | | | | | 0.7 | 0.3 | 0.7 | | 0.5 | 0.5 |
| Phosphorus-containing compound | FP-300*5 | 20 | | | 30 | 20 | 20 | 20 | | 20 | 20 | 20 | 20 | 20 | 20 |
| | HFA-6065E*6 | 30 | 30 | | 30 | 30 | 30 | | 30 | 30 | 30 | 30 | 30 | 30 | 30 |
| | VYLON 337DPM50*7 | 10 | | | 10 | 10 | 10 | 10 | | | | | | | |
| | Exolit OP 935*8 | | 10 | | 5 | | | 10 | 20 | 7 | | | | | |

TABLE 1-continued

| Components | | Examples | | | | | | | | | | | | | |
|---|---|---|---|---|---|---|---|---|---|---|---|---|---|---|---|
| (parts by weight) | | 1 | 2 | 3 | 4 | 5 | 6 | 7 | 8 | 9 | 10 | 11 | 12 | 13 | 14 |
| Thermo-setting resin | RE-306CA90[*9] | 25 | 25 | | | 5 | 5 | | | | | | | | |
| | NC-3000-H-CA75[*10] | | | 50 | 40 | 40 | 40 | 35 | 30 | 35 | 40 | 40 | 40 | 40 | 40 |
| | TPA-B80E[*11] | | | | | | | 5 | | | | | | | |
| | PB3600[*12] | | | | | | | | 10 | | | | | | |
| | BMI-5100[*13] | | | | | | | | | 10 | | | | | |
| Aluminum hydroxide slurry | | 70 | 70 | 200 | | 70 | 70 | 70 | 70 | 70 | 70 | 70 | 70 | 70 | 70 |
| Photosensitive compound | UX2301[*14] | 20 | 30 | 20 | 20 | 20 | 20 | 25 | 20 | 20 | 20 | 20 | 20 | 20 | 20 |
| | M-350[*15] | 5 | 5 | | | 5 | 5 | | | | 5 | | | 5 | 5 |
| Silica slurry | | 50 | 30 | 30 | 30 | 30 | 30 | 30 | 30 | 30 | 30 | 30 | 30 | | 30 |
| Melamine | | 3 | 3 | 3 | 3 | 3 | 3 | 3 | 3 | 3 | 3 | 3 | 3 | 3 | 3 |
| DHT-4A[*16] | | 5 | 5 | 5 | 5 | 5 | 5 | 5 | 5 | 5 | 5 | 5 | 5 | 5 | 5 |
| IRGANOX 1010[*17] | | 1 | 1 | 1 | 1 | 1 | 1 | 1 | 1 | 1 | 1 | 1 | 1 | 1 | 1 |
| CR97[*18] | | | | | | | | | | | | | | 50 | |
| Carbon black | | | | | | | | | | | | | | | 0.8 |
| Colorant[*19] | | 1.1 | 1.1 | 1.1 | 1.1 | 1.1 | 1.1 | 1.1 | 1.1 | 1.1 | 1.1 | 1.1 | 1.1 | | |
| Silicone-based anti-foaming agent | | 3 | 3 | 3 | 3 | 3 | 3 | 3 | 3 | 3 | 3 | 3 | 3 | 3 | 3 |

Remarks
[*1]Acylphosphine oxide-based photopolymerization initiator, LUCIRIN TPO manufactured by BASF Corporation
[*2]IRGACURE 907 manufactured by Ciba Japan Co., Ltd. (2-methyl-1-[4-(methylthio)phenyl]-2-morpholinopropan-1-one)
[*3]Oxime ester-based photopolymerization initiator manufactured by Ciba Japan Co., Ltd.
[*4]Photopolymerization initiator, ADEKA ARKLS NCI-831 manufactured by ADEKA CORPORATION
[*5]Phosphorus-containing compound manufactured by FUSHIMI Pharmaceutical Co., Ltd.
[*6]Phosphorus-containing compound, HFA-6065E manufactured by SHOWA Highpolymer Co., Ltd. (solid content 64%, ethyl carbitol 36%)
[*7]Solvent-soluble phosphorus-containing polyester manufactured by TOYOBO CO., LTD. (solid content 50%, dipropylene glycol monomethyl ether 50%)
[*8]Phosphorus-containing compound manufactured by Clariant (Japan) K.K.
[*9]Phenol novolak type epoxy resin manufactured by Nippon Kayaku Co., Ltd., solid content 90%, carbitol acetate 10%
[*10]Biphenol novolak type epoxy resin manufactured by Nippon Kayaku Co., Ltd., solid content 75%, carbitol acetate 25%
[*11]Blocked isocyanate manufactured by Asahi Kasei Chemicals Corp.
[*12]Epoxidized polybutadiene manufactured by Daicel Chemical Industries Ltd.
[*13]Bismaleimide compound manufactured by Daiwakasei Industry Co., Ltd.
[*14]Bifunctional urethane acrylate manufactured by Nippon Kayaku Co., Ltd.
[*15]EO-modified trimethylol propane triacrylate manufactured by TOAGOSEI Co., Ltd.
[*16]Hydrotalcite compound manufactured by Kyowa Chemical Industry Co., Ltd.
[*17]Antioxidant manufactured by Chiba Japan Co., Ltd.
[*18]Titanium dioxide manufactured by Ishihara Sangyo Co., Ltd.
[*19]0.3 Part of C.I. Pigment Blue 15:3 and 0.8 part C.I. Pigment Yellow 147

TABLE 2

| Components | | Comparative Examples | | |
|---|---|---|---|---|
| (parts by weight) | | 1 | 2 | 3 |
| Carboxyl group-containing resin | Varnish 1 | | | |
| | Varnish 2 | 156 | | |
| | Varnish 3 | | 156 | |
| | Varnish 4 | | | 200 |
| Photopoly-merization initiator | TPO [*1] | 10 | 10 | 10 |
| | 907 [*2] | | | |
| | OXE-02 [*3] | 1.5 | 1.5 | 1.5 |
| | NCI-831 [*4] | | | |
| Phosphorus-containing compound | FP-300 [*5] | 20 | 20 | 20 |
| | IIFA-6065E [*6] | 30 | 30 | 30 |
| | VYLON 337DPM50 [*7] | 5 | 5 | 5 |
| | Exolit OP 935 [*8] | | | |
| Thermo-setting resin | RE-306CA90 [*9] | 25 | 25 | 25 |
| | NC-3000-H-CA75 [*10] | | | |
| | TPA-B80E [*11] | | | |
| | PB3600 [*12] | | | |
| | BMI-5100 [*13] | | | |
| Aluminum hydroxide slurry | | 70 | 70 | 70 |
| Photosensitive compound | UX2301 [*14] | 20 | 20 | 20 |
| | M-350 [*15] | 5 | 5 | 5 |
| Silica slurry | | 50 | 30 | 30 |
| Melamine | | 3 | 3 | 3 |
| DHT-4A [*16] | | 5 | 5 | 5 |
| IRGANOX 1010 [*17] | | 1 | 1 | 1 |
| CR97 [*18] | | | | |
| Carbon black Colorant [*19] | | 1.1 | 1.1 | 1.1 |
| Silicone-based anti-foaming agent | | 3 | 3 | 3 |

Remarks Respective meanings of the symbols are the same as those described in Table 1.

Optimum Exposure Dose:

After a substrate having a circuit pattern of copper of 18 μm thickness formed in advance thereon was polished by the use of a buffing roll, washed with water, and dried, each of the photosensitive resin compositions of Examples 1-14 and Comparative Examples 1-3 was applied by a screen printing method onto the entire surface of the substrate. The coating film on the substrate was dried in a hot air circulating drying oven at 80° C. for 30 minutes. Thereafter, the coating film was exposed to light through a step tablet (KODAK No. 2) by the use of an exposure apparatus (HMW-680-GW20 manufactured by ORC Manufacturing Co., Ltd.) equipped with metal halide lamps and developed for 60 seconds with an aqueous 1 wt. % $Na_2CO_3$ solution of 30° C. under a spraying pressure of 0.2 MPa. The exposure dose by which six patterns of the step tablet remained after the development was rated as the optimum exposure dose or optimum irradiation dose.

Evaluation of Characteristics:

Each of the compositions of Examples 1-14 and Comparative Examples 1-3 was applied by a screen printing method onto the entire surface of a polyimide film substrate having a circuit pattern formed in advance thereon or Kapton 100H (polyimide film manufactured by Du Pont-Toray Co., Ltd., thickness: 25 μm). The coating film on the substrates was dried at 80° C. for 30 minutes and left cooling to room temperature. This substrate was exposed to light according to a solder resist pattern with the optimum exposure dose by the use of the exposure apparatus (HMW-680-GW20) equipped with metal halide lamps and developed for 60 seconds with an aqueous 1 wt. % $Na_2CO_3$ solution of 30° C. under the condition of a spraying pressure of 0.2 MPa to obtain a resist pattern. The coating film on this substrate was cured by heating at 150° C. for 60 minutes. The characteristics of the obtained printed substrate (test substrate) were evaluated in the following manner.

<Resistance to Soldering Heat>

The test substrate prepared from the polyimide film substrate having a circuit pattern formed in advance was coated with a rosin-based flux, repeatedly immersed in a solder bath previously set at 260° C., and visually examined as to the blister or separation of the resist layer after washing the flux with a denatured alcohol. The criterion for evaluation is as follows:

○: Separation of the resist layer is not found after one time immersion for 10 seconds.

Δ: Separation of the resist layer is not found after one time immersion for 5 seconds.

x: Blister and separation of the resist layer are found after one time immersion for 5 seconds.

<Resistance to Electroless Gold Plating>

Each test substrate was plated successively in an electroless nickel plating bath and an electroless gold plating bath, both available in the market, under the conditions of 3 μm of nickel and 0.03 μm of gold. Then, the plated test substrate was examined to determine whether or not the resist layer was separated and whether or not the resist layer had been infiltrated with the plating solution. Thereafter, the test substrate was subjected to a peeling test with an adhesive tape to evaluate the separation of the resist layer. The criterion for evaluation is as follows:

○: Infiltration with the plating solution and separation of the resist layer are not observed.

Δ: Slight Infiltration with the plating solution is observed after plating, but no separation of the resist layer is observed after the tape peeling test.

x: Separation of the resist layer is observed after plating.

<Slightness of Warpage>

The cured film formed on Kapton 100H was cut into the size of 50×50 mm. The degrees of warpage of the four corners were measured, and the average value was calculated and evaluated on the following criterion.

○: The warpage is 0 mm to <3 mm.

Δ: The warpage is not less than 3 mm and less than 7 mm.

x: The warpage is not less than 7 mm.

<Bending Properties>

The cured film formed on Kapton 100H was folded repeatedly and the number of repetition just before the occurrence of a crack in the cured film was recorded.

<Flame Retardancy>

Each of the compositions of Examples and Comparative Examples was applied by a screen printing method onto the entire surface of a polyimide film (Kapton 100H) of 25 μm thickness and a polyimide film (Kapton 50H) of 12.5 μm thickness. The coating film on the film was dried at 80° C. for 20 minutes and left cooling to room temperature. Further, the composition was also applied by a screen printing method onto the entire surface of the back surface of the film, and the resultant coating film on the film was dried at 80° C. for 20 minutes and left cooling to room temperature to obtain a double-coated substrate. The resultant double-coated substrate was exposed to light according to a solder resist pattern with the optimum exposure dose by the use of the exposure apparatus (HMW-680-GW20) equipped with metal halide lamps and developed for 60 seconds with an aqueous 1 wt. % $Na_2CO_3$ solution of 30° C. under the condition of a spraying pressure of 0.2 MPa. The coating film on this substrate was then thermally cured at 150° C. for 60 minutes to obtain a test sample. This test sample for flame-retardant evaluation was subjected to a vertical flame retardancy test for thin materials in accordance with the method specified in UL94. Evaluation was expressed as VTM-0 or VTM-1 based on UL94 standard.

The results of respective evaluation tests mentioned above are collectively shown in Tables 3 and 4.

TABLE 3

| Properties | | Examples | | | | | | |
| --- | --- | --- | --- | --- | --- | --- | --- | --- |
| | | 1 | 2 | 3 | 4 | 5 | 6 | 7 |
| Optimum exposure dose (mJ/cm$^2$) | | 150 | 150 | 150 | 150 | 150 | 150 | 150 |
| Resistance to soldering heat | | ○ | ○ | ○ | ○ | ○ | ○ | ○ |
| Resistance to electroless gold plating | | ○ | ○ | ○ | ○ | ○ | Δ | ○ |
| Slightness of warpage | | ○ | ○ | ○ | ○ | ○ | ○ | ○ |
| Bending properties (times) | | ≥5 | ≥5 | 1 | ≥5 | ≥5 | ≥5 | ≥5 |
| Flame retardancy | Kapton 100 H | Equiv. to VTM-0 | Equiv. to VTM-0 | Equiv. to VTM-0 | Equiv. to VTM-0 | Equiv. to VTM-0 | Equiv. to VTM-0 | Equiv. to VTM-0 |
| | Kapton 50 H | Burned | Equiv. to VTM-0 | Burned | Burned | Equiv. to VTM-0 | Burned | Equiv. to VTM-0 |

TABLE 3-continued

| Properties | Examples | | | | | | |
|---|---|---|---|---|---|---|---|
| | 8 | 9 | 10 | 11 | 12 | 13 | 14 |
| Optimum exposure dose (mJ/cm$^2$) | 150 | 100 | 120 | 100 | 400 | 300 | 500 |
| Resistance to soldering heat | ○ | ○ | ○ | ○ | ○ | ○ | ○ |
| Resistance to electroless gold plating | ○ | ○ | ○ | ○ | ○ | ○ | ○ |
| Slightness of warpage | ○ | ○ | ○ | ○ | Δ | ○ | ○ |
| Bending properties (times) | ≥5 | ≥5 | ≥5 | ≥5 | 4 | 3 | 3 |
| Flame retardancy Kapton 100 H | Equiv. to VTM-0 | Equiv. to VTM-0 | Equiv. to VTM-0 | Equiv. to VTM-0 | Equiv. to VTM-0 | Equiv. to VTM-0 | Equiv. to VTM-0 |
| Kapton 50 H | Equiv. to VTM-0 | Equiv. to VTM-0 | Equiv. to VTM-0 | Equiv. to VTM-0 | Equiv. to VTM-0 | Equiv. to VTM-0 | Equiv. to VTM-0 |

TABLE 4

| Properties | Comparative Examples | | |
|---|---|---|---|
| | 1 | 2 | 3 |
| Optimum exposure dose (mJ/cm$^2$) | 100 | 150 | 250 |
| Resistance to soldering heat | ○ | ○ | Δ |
| Resistance to electroless gold plating | ○ | ○ | Δ |
| Slightness of warpage | Δ | X | ○ |
| Bending properties (times) | 4 | 1 | ≥5 |
| Flame retardancy Kapton 100H | Burned | Equivalent to VTM-0 | Burned |
| Kapton 50H | Burned | Equivalent to VTM-0 | Burned |

As being clearly noted from the results shown in Table 3, in Examples 1 to 14 the slight warpage and bending properties sufficient for the solder resist for flexible wiring boards as well as excellent flame retardancy had been attained. On the contrary, as shown in Table 4, in Comparative Examples it was hardly possible to establish the balance between the slight warpage and bending properties and the flame retardancy.

Therefore, it will be clear that the photosensitive resin composition excelling in all the slight warpage, bending properties and the flame retardancy may be obtained according to the present invention.

Examples 15 to 28

Each of the compositions of Examples 1-14, but excluding the silicone-based anti-foaming agent, was diluted with methyl ethyl ketone, applied to a PET film, and then dried at 80° C. for 30 minutes to form a layer of the photosensitive resin composition of 20 μm in thickness. Thereafter, a cover film was laminated thereon to prepare a dry film. They correspond to Examples 15 to 28, respectively.

The cover film was separated from the dry film obtained as described above, and the dry film was thermally laminated onto a copper foil-laminated substrate having a prescribed pattern formed in advance thereon and then exposed to light under the same conditions as those used for Evaluation of Characteristics of a coating film of Examples mentioned above. After exposure to light, the carrier film was removed from the substrate, and then the photo-cured film was developed for 60 seconds with an aqueous 1 wt. % Na$_2$CO$_3$ solution of 30° C. under the condition of a spraying pressure of 0.2 MPa to obtain a resist pattern. The photo-cured film on this substrate was cured by heating at 150° C. for 60 minutes. The obtained test substrate having the cured film was examined for various characteristics in the same testing method and the same evaluation method as described above. The results are shown in Table 5.

TABLE 5

| Properties | Examples | | | | | | |
|---|---|---|---|---|---|---|---|
| | 15 | 16 | 17 | 18 | 19 | 20 | 21 |
| Optimum exposure dose (mJ/cm$^2$) | 150 | 150 | 150 | 150 | 150 | 150 | 150 |
| Resistance to soldering heat | ○ | ○ | ○ | ○ | ○ | ○ | ○ |
| Resistance to electroless gold plating | ○ | ○ | ○ | ○ | ○ | Δ | ○ |
| Slightness of warpage | ○ | ○ | ○ | ○ | ○ | ○ | ○ |

TABLE 5-continued

| | | | | | | | | |
|---|---|---|---|---|---|---|---|---|
| Bending properties (times) | | ≥5 | ≥5 | 1 | 5 | ≥5 | ≥5 | ≥5 |
| Flame retardancy | Kapton 100 H | Equiv. to VTM-0 | Equiv. to VTM-0 | Equiv. to VTM-0 | Equiv. to VTM-0 | Equiv. to VTM-0 | Equiv. to VTM-0 | Equiv. to VTM-0 |
| | Kapton 50 H | Burned | Equiv. to VTM-0 | Burned | Burned | Equiv. to VTM-0 | Burned | Equiv. to VTM-0 |

| | | Examples | | | | | | |
|---|---|---|---|---|---|---|---|---|
| Properties | | 22 | 23 | 24 | 25 | 26 | 27 | 28 |
| Optimum exposure dose (mJ/cm²) | | 150 | 100 | 120 | 100 | 400 | 300 | 500 |
| Resistance to soldering heat | | ○ | ○ | ○ | ○ | ○ | ○ | ○ |
| Resistance to electroless gold plating | | ○ | ○ | ○ | ○ | ○ | ○ | ○ |
| Slightness of warpage | | ○ | ○ | ○ | ○ | Δ | ○ | ○ |
| Bending properties (times) | | ≥5 | ≥5 | ≥5 | ≥5 | 4 | 3 | 3 |
| Flame retardancy | Kapton 100 H | Equiv. to VTM-0 | Equiv. to VTM-0 | Equiv. to VTM-0 | Equiv. to VTM-0 | Equiv. to VTM-0 | Equiv. to VTM-0 | Equiv. to VTM-0 |
| | Kapton 50 H | Equiv. to VTM-0 | Equiv. to VTM-0 | Equiv. to VTM-0 | Equiv. to VTM-0 | Equiv. to VTM-0 | Equiv. to VTM-0 | Equiv. to VTM-0 |

As being clearly noted from the results shown in Table 3 and Table 5, the photosensitive resin composition of the present invention is capable of forming a cured film which exhibits not only the slight warpage but also the resistance to soldering heat and resistance to electroless gold plating, which have trade-off relations with the warpage, and further the excellent bending properties and the flame retardancy.

INDUSTRIAL APPLICABILITY

Since the alkali-developable photosensitive resin composition of the present invention is a halogen-free formulation imposing little burden on the environment and capable of forming a film which is flame-retardant and reduced in warpage, exhibits excellent bending characteristics, it is suitable as a solder resist for printed wiring boards, particularly for flexible wiring boards (FPC) represented by TAB (tape automated bonding), COF (chip-on film), etc.

The International Application PCT/JP2010/072355, filed Dec. 13, 2010, describes the invention described hereinabove and claimed in the claims appended hereinbelow, the disclosure of which is incorporated here by reference.

What is claimed is:

1. An alkali-developable photosensitive resin composition for a printed wiring board, comprising:
   a carboxyl group-containing urethane resin having a biphenyl novolak structure;
   a photopolymerization initiator; and
   aluminum hydroxide,
   wherein said carboxyl group-containing urethane resin is a carboxyl group-containing urethane resin obtained by causing a diol compound produced by reaction of an epoxy resin having a biphenyl novolak structure and a monobasic acid to react with a carboxyl group-containing diol compound and a diisocyanate compound, and the monobasic acid has a (meth)acryloyl group.

2. The photosensitive resin composition according to claim 1, wherein said photopolymerization initiator includes an oxime ester compound.

3. The photosensitive resin composition according to claim 1, further comprising a thermosetting component.

4. A dry film obtained by applying the photosensitive resin composition according to claim 1 on a film and drying the photosensitive resin composition according to claim 1 on the film.

5. A printed wiring board comprising a substrate and a cured film formed on the substrate, said cured film being obtained by applying the photosensitive resin composition according to claim 1 on the substrate to form a coating film and photo-curing the coating film in a predetermined pattern.

6. A printed wiring board comprising a substrate and a cured film formed on the substrate, said cured film being obtained by laminating a dry film according to claim 4 on the substrate to form a coating film and photo-curing the coating film in a predetermined pattern.

7. An alkali-developable photosensitive resin composition for a printed wiring board, comprising:
   a carboxyl group-containing urethane resin having a biphenyl novolak structure;
   a photopolymerization initiator; and
   a phosphorus-containing compound,
   wherein said carboxyl group-containing urethane resin is a carboxyl group-containing urethane resin obtained by causing a diol compound produced by reaction of an epoxy resin having a biphenyl novolak structure and a monobasic acid to react with a carboxyl group-containing diol compound and a diisocyanate compound, and the monobasic acid has a (meth)acryloyl group.

8. The photosensitive resin composition according to claim 7, wherein said photopolymerization initiator includes an oxime ester compound.

9. The photosensitive resin composition according to claim 7, further comprising a thermosetting component.

10. A dry film obtained by applying the photosensitive resin composition according to claim 7 on a film and drying the photosensitive resin composition according to claim 7 on the film.

11. A printed wiring board comprising a substrate and a cured film formed on the substrate, said cured film being obtained by applying the photosensitive resin composition according to claim 7 on the substrate to form a coating film and photo-curing the coating film in a predetermined pattern.

12. A printed wiring board comprising a substrate and a cured film formed on the substrate, said cured film being obtained by laminating a dry film according to claim 10 on the substrate to form a coating film and photo-curing the coating film in a predetermined pattern.

13. An alkali-developable photosensitive resin composition for a printed wiring board, comprising:
   a carboxyl group-containing urethane resin having a biphenyl novolak structure;
   a photopolymerization initiator;
   aluminum hydroxide; and
   a phosphorus-containing compound,
   wherein said carboxyl group-containing urethane resin is a carboxyl group-containing urethane resin obtained by causing a diol compound produced by reaction of an epoxy resin having a biphenyl novolak structure and a monobasic acid to react with a carboxyl group-containing diol compound and a diisocyanate compound, and the monobasic acid has a (meth)acryloyl group.

14. The photosensitive resin composition according to claim 13, wherein said photopolymerization initiator includes an oxime ester compound.

15. The photosensitive resin composition according to claim 13, further comprising a thermosetting component.

16. A dry film obtained by applying the photosensitive resin composition according to claim 13 on a film and drying the photosensitive resin composition according to claim 13.

17. A printed wiring board comprising a substrate and a cured film formed on the substrate, said cured film being obtained by applying the photosensitive resin composition according to claim 13 on the substrate to form a coating film and photo-curing the coating film in a predetermined pattern.

18. A printed wiring board comprising a substrate and a cured film formed on the substrate, said cured film being obtained by laminating a dry film according to claim 16 on the substrate to form a coating film and photo-curing the coating film in a predetermined pattern.

* * * * *